United States Patent [19]

Mikoshiba et al.

[11] Patent Number: 5,180,687

[45] Date of Patent: Jan. 19, 1993

[54] DEPOSITED FILM FORMATION METHOD UTILIZING SELECTIVE DEPOSITION BY USE OF ALKYL ALUMINUM HYDRIDE

[75] Inventors: Nobuo Mikoshiba; Kazuo Tsubouchi; Kazuya Masu, all of Sendai, Japan

[73] Assignee: Canon Kabushiki Kaisha, Tokyo, Japan

[21] Appl. No.: 587,045

[22] Filed: Sep. 24, 1990

[30] Foreign Application Priority Data

Sep. 26, 1989 [JP] Japan .................. 1-250021
Feb. 19, 1990 [JP] Japan .................. 2-36198

[51] Int. Cl.⁵ .................. H01L 21/285
[52] U.S. Cl. .................. 437/187; 437/194; 437/195; 437/203
[58] Field of Search ............ 148/DIG. 25, DIG. 26, 148/46, 93, 158, 169, 33, 33.1, 33.2; 357/65, 68; 437/89, 90, 108, 111, 173, 170, 187, 192, 194, 195, 203, 915, 942

[56] References Cited

U.S. PATENT DOCUMENTS

| | | | |
|---|---|---|---|
| 4,497,683 | 2/1985 | Celler et al. | 437/89 |
| 4,786,615 | 11/1988 | Liaw et al. | 437/89 |
| 4,804,560 | 2/1989 | Shioya et al. | 437/192 |
| 4,824,802 | 4/1989 | Brown et al. | 437/192 |
| 4,898,841 | 2/1990 | Ho | 437/192 |
| 4,902,645 | 2/1990 | Ohba | 437/195 |
| 4,920,403 | 4/1990 | Chow et al. | 437/192 |
| 4,960,732 | 10/1990 | Dixit et al. | 437/195 |
| 4,963,511 | 10/1990 | Smith | 437/192 |
| 5,006,484 | 4/1991 | Harada | 437/195 |

FOREIGN PATENT DOCUMENTS

| | | | |
|---|---|---|---|
| 0011227 | 1/1987 | Japan | 437/203 |
| 63-33569 | 2/1988 | Japan . | |
| 0066932 | 3/1988 | Japan | 437/203 |
| 1252776 | 10/1989 | Japan . | |
| 0276624 | 11/1989 | Japan | 437/89 |
| 2012913 | 1/1990 | Japan | 437/195 |
| 0058217 | 2/1990 | Japan | 437/203 |
| 0185026 | 7/1990 | Japan . | |
| 2170419 | 7/1990 | Japan . | |
| 2185026 | 7/1990 | Japan . | |

OTHER PUBLICATIONS

R. A. Levy et al., "Characterization of LPCVD Aluminum for VLSI Processing", Journal of the Electrochemical Society, vol. 131, No. 9, pp. 2175-2182, Sep. 1984.
R. Bhat et al., "The Growth and Characterization of AlGaAs Using Dimethyl Aluminum Hydride", Journal of Crystal Growth, vol. 77, pp. 7-10 (1986).
M. Hanabusa et al., "Photochemical Vapor Deposition of Aluminum Thin Films Using Dimethylaluminum Hydride", Japanese Journal of Applied Physics, vol. 27, No. 8, pp. L1392-L1394, Aug. 1988.
A. Sekiguchi et al., "Gas-Temperature-Controlled (GTC) CVD of Aluminum and Aluminum-Silicon Alloy Film for VLSI Processing", Japanese Journal of Applied Physics, vol. 27, No. 11, pp. L2134-L2136, Nov. 1988.
Pierson, Thin Solid Films, vol. 45, pp. 257-263 (1977).
Hanabusha, et al., Japanese Journal of Applied Physics, vol. 27, No. 8, pp. 1392-1394 (Aug., 1988).

Primary Examiner—Olik Chaudhuri
Assistant Examiner—Ourmazd S. Ojan
Attorney, Agent, or Firm—Fitzpatrick, Cella, Harper & Scinto

[57] ABSTRACT

By providing a deposited film formation method in which aluminum or a metal composed mainly of aluminum of good quality is selectively deposited according to the CVD method utilizing an alkyl aluminum hydride and hydrogen, and then pure aluminum or a metal composed mainly of aluminum is non-selectively deposited, it becomes possible to form an electroconductive film of good quality within fine openings or on an insulating layer.

21 Claims, 9 Drawing Sheets

DEPOSITED FILM FORMATION METHOD UTILIZING SELECTIVE DEPOSITION BY USE OF ALKYL ALUMINUM HYDRIDE

BACKGROUND OF THE INVENTION

1. Field of the Invention

This invention relates to a deposited film formation method, particularly to a deposited film formation method of Al or a metal composed mainly of Al which can be preferably applied to electrodes or wiring of a semiconductor integrated circuit device, etc.

2. Related background art

In the prior art, in electronic devices or integrated circuits by use of semiconductors, for electrodes and wiring, aluminum (Al) or a steel containing aluminum as main component such as Al—Si and the like has been primarily used. Al has many advantages such that it is inexpensive and high in electroconductivity, that it can be also internally chemically protected because a dense oxidized film can be formed on the surface, and that it has good adhesion to Si, etc.

As the method for forming a film for electrodes and wiring of Al or Al—Si as mentioned above, there has been used in the prior art the sputtering method such as magnetron sputtering, etc.

However, selective deposition and selective growth can not be realized by the sputtering method which has been used in the prior art. The sputtering is the physical deposition method based on flying of sputtered particles in vacuum, the film thickness at the stepped portion or the insulating film side wall becomes extremely thin, leading to wire breaking in an extreme case. Nonuniformity of film thickness or wire breaking has the drawback that reliability of LSI is markedly lowered.

On the other hand, since the integration degree of the integrated circuit such as LSI, etc. is increased, and fine formation of wiring or multi-layer wiring has been particularly required in recent years, there is an increasing severe demand not found up to data for Al or Al—Si wiring of the prior art. With finer dimensional formation by increased integration degree, the surface of LSI, etc. is subject to excessive unevenness due to oxidation, diffusion, thin film deposition, and etching, etc. For example, electrodes or wiring metal must be deposited on the surface with a stepped difference, or deposited in a via-hole which is fine in diameter and deep. In 4 Mbit or 16 Mbit DRAM (dynamic RAM), etc., the aspect ration (via-hole depth/via-hole diameter) of via-hole in which a metal composed mainly of Al such as Al—Si, etc. is to be deposited is 1.0 or more, and the via-hole diameter itself also becomes 1 $\mu$m or less. Therefore, even for a via-hole with large aspect ratio, the technique which can deposit an Al—Si compound is required.

Particularly, for performing sure electrical connection to the device under insulating film such as $SiO_2$, etc., rather than film formation, Al—Si is required to be deposited so as to embed only the via-hole of the device. In such case, a method of depositing an Al alloy only on Si or metal surface and not depositing it on an insulating film such as $SiO_2$, etc. is required.

As the improved sputtering method, there has been developed the bias sputtering method in which a bias is applied on a substrate and deposition is performed so as to embed Al or an Al—Si compound only in the via-hole by utilizing the sputter etching action and the deposition action on the substrate surface. However, since the bias voltage of some 100 V or higher is applied on the substrate, deleterious influence on the device occurs because of charged particle damaging such as change in threshold of MOS-FET, etc. Also, because of presence of both etching action and deposition action, there is the problem that the deposition speed cannot be essentially improved.

In order to solve the problems as described above, various types of CVD (Chemical Vapor Deposition) methods have been proposed. In these methods, chemical reaction of the starting gas in some form is utilized. In plasma CVD or optical CVD, decomposition of the starting gas occurs in gas phase, and the active species formed there further reacts on the substrate to give rise to film formation. In these CVD methods, surface coverage on unevenness on the substrate surface is good. However, carbon atoms contained in the starting gas molecular are incorporated into the film. Also, particularly in plasma CVD, the problem remained that there was damage by charged particles (so called plasma damage) as in the case of the sputtering method.

The thermal CVD method, in which the film grows through the surface reaction primarily on the substrate surface, is good in surface coverage on unevenness such as stepped portion of the surface, etc. Also, it can be expected that deposition within via-hole will readily occur. Further, wire breaking at the stepped portion can be avoided. Furthermore, there are not caused damages by charged particles which have been observed in the case of the plasma CVD or the sputtering method. The methods of such a kind include, for example, the method seen in Journal of Electrochemical Society, Vol. 131, p. 2175 (1984). In this method triisobutyl aluminum (i-$C_4H_9$)$_3$Al (TIBA) is used as organic aluminum gas and an Al film is formed at a film formation temperature of 260° C. and a reaction tube pressure of 0.5 Torr. The substrate temperature is then maintained at about 450° C. and $SiH_4$ is introduced to diffuse Si in the Al film, thus obtaining an Al—Si film.

When TIBA is to be used, a continuous film can not be obtained unless pretreatment is effected in which prior to film formation, $TiCl_4$ is flowed to activate the substrate surface to form nuclei. Furthermore, in case where TIBA is used, there is a problem that surface flatness is not sufficient even when $TiCl_4$ is used. By this method it is not possible to effect selective growth such as Al—Si deposition only in via-holes.

As another method, there can be mentioned the method described in Japanese Journal of Applied Physics, Vol. 27, No. 11, p. L2134 (1988). In this method, TIBA and $Si_2H_6$ diluted with Ar gas are supplied, and the gases are heated before TIBA reaches the substrate. By this method, an Al—Si film of a low resistivity can be epitaxially grown on a Si(100) wafer. Although the film obtained by this method has good high quality, there are involved the problems that control is difficult due to necessity of heating the gases and that apparatus for effecting this method is complicated.

Japanese Laid-Open Patent Application No. 63-33569 describes a method of forming a film by using no $TiCl_4$, but using in place thereof organic aluminum and heating it in the vicinity of the substrate. According to this method, Al can be deposited selectively only on the metal or semiconductor surface from which the naturally oxidized film has been removed.

In this case, it is clearly stated that the step of removing the naturally oxidized film on the substrate surface is necessary before introduction of TIBA. Also, it is described that, since TIBA can be used alone, no carrier gas is required to be used, but Ar gas may be also used as the carrier gas. However, the reaction of TIBA with another gas (e.g. $H_2$) is not contemplated at all, and there is no description of use of $H_2$ as the carrier gas. Also, in addition to TIBA, trimethyl aluminum (TMA) and triethyl aluminum (TEA) are mentioned, but there is no specific description of other organic metals. This is because, since the chemical properties of organic metals generally vary greatly if the organic substituent attached to the metal element varies little, it is necessary to investigate individually in detailed experimentation to determine what organic metal should be used.

In the CVD method as described above, not only there is an inconvenience that the naturally oxidized film must be removed, but also there is the drawback that no surface smoothness can be obtained. Also, there is the restriction that heating of the gas is necessary, and yet heating must be done in the vicinity of the substrate. Besides, it must also be experimentally determined at what proximity to the substrate heating must be done, whereby there is also the problem that the place for setting the heater cannot be necessarily freely chosen.

In the pre-text of the 2nd Symposium of Electrochemical Society, Branch of Japan (Jul. 7, 1989), on page 75, there is a description of film formation of Al according to the double wall CVD method. In this method, TIBA is used and the device is designed so that the gas temperature of TBA can be made higher than the substrate temperature. This method may be also regarded as a modification of the above-mentioned Japanese Laid-open Patent Application No. 63-33569. Also in this method, Al can be selectively grown only on a metal or semiconductor, but not only the difference between the gas temperature and the substrate surface temperature can be controlled with difficulty, but also there is the drawback that the bomb and the pipeline must be heated. Moreover, according to this method, there are involved such problems that no uniform continuous film can be formed, that flatness of the film is poor, etc., unless the film is made thick to some extent.

As set forth above, the prior art method have the problems to be solved that it is difficult to obtain a flat Al—Si film of a low resistivity and good quality, that there is considerable limitation in apparatus and in film formation.

As described above, prior art methods cannot necessarily effect well selective growth of Al—Si, and even if possible, there is a problem with respect to flatness, resistance, purity, etc. of the Al film formed. Also, there has been involved the problem that the film formation method is complicated and can be controlled with difficulty.

According to the method described in Journal of Electrochemical Society, Vol. 131, p. 2175 (1984), supra, surface flatness of Al is poor, and yet Al within via-hole cannot become dense inadequately (see FIG. 1A). In FIG. 1A, 90 is a single crystalline Si substrate, 91 an insulating film comprising $SiO_2$, and 92 a deposited film of Al.

Also, in the method described in the technique of Japanese Patent Application Laid-Open No. 63-33569, since surface smoothness of Al within via-hole which is a great premise is not sufficient, increase of resistivity at the interface between the Al film according to the CVD method and the Al film according to the sputtering method will be brought about (see FIG. 1B). In FIG. 1B, 92-1 shows the selectively deposited film of Al according to the CVD method, 92-2 deposited film of Al according to the sputtering method, and 92-3 the causes of characteristic deterioration such as impurity at the interface, etc.

As described above, the methods of the prior art cannot necessarily cause selective growth of Al to occur successfully, or even if possible, problems are involved with respect to flatness, purity of Al film, and therefore, for further deposition of Al also on an insulating film, there is the problem with respect to continuity between the Al within via-hole and the Al on the insulating film. Also, the film formation methods are complicated and difficulty controllable, and therefore they are not advantageous methods as the preparation technique of semiconductor integrated circuit which require essentially preparation at low cost. Particularly, the problems in performing multi-layer wiring are great.

As described above, in the technical field of semiconductors of which higher integration has been desired, for providing a semiconductor device of higher integration and higher performance inexpensively, there existed many rooms to be improved.

SUMMARY OF THE INVENTION

The present invention has been accomplished in view of the technical tasks as described above, and is intended to provide a deposited film formation method utilizing the method capable of forming a film of Al or a metal composed mainly of Al which is excellent in flatness and of good quality as electroconductive material with good controllability at a desired position.

Another object of the present invention is to provide a deposited film formation method of a film of Al or a metal composed mainly of Al which is very broad in general purpose availability without requiring a complicated and expensive deposited film formation device.

Another object of the present invention is to provide in the first place a method for forming a deposited film having sufficiently excellent characteristics also as the three-dimensional wiring by forming a film enhanced in denseness, flatness within via-hole according to the selective deposition method and further depositing non-selectively Al of good quality continuously from via-hole also on an insulating film.

Further, another object of the present invention is to provide a method for forming an electroconductive deposited film which becomes wiring of good quality excellent in step coverage.

Another object of the present invention is to provide a deposited film formation method comprising the steps of:

arranging a substrate having an electron donative surface (A) and a non-electron donative surface (B) in a space for deposited film formation, introducing at least a gas of an alkyl aluminum hydride and hydrogen gas into said space for deposited film formation, maintaining the temperature of said electron donative surface (A) within the range of the decomposition temperature of said alkyl aluminum hydride or higher and 450° C. or lower, thereby forming selectively an aluminum film or a metal film composed mainly of aluminum on said electron donative surface (A), and modifying the surface of said non-electron donative surface (B), and forming an aluminum film or a metal film composed mainly of aluminum on said surface (B) and on said aluminum film or metal film composed mainly of aluminum selectively deposited.

Still another object of the present invention is to provide a deposited film formation method comprising the steps of:

arranging a substrate having an electron donative surface (A) and a non-electron donative surface (B) in a space for deposited film formation in the CVD device capable of generating a plasma, introducing at least a gas of an alkyl aluminum hydride and hydrogen gas into said space for deposited film formation, maintaining the temperature of said electron donative surface (A) within the range of the decomposition temperature of said alkyl aluminum hydride or higher and 450° C. or lower, thereby forming selectively an aluminum film or a metal film composed mainly of aluminum on said electron donative surface (A), modifying the surface of said non-electron donative surface (B) by generating a plasma in said device while introducing at least a gas of alkyl aluminum hydride and hydrogen gas, and forming an aluminum film or a metal film composed mainly of aluminum on said aluminum film or metal film composed mainly of aluminum and said modified non-electron donative surface (B).

Still another object of the present invention is to provide a deposited film formation method by feeding a gas of an alkyl aluminum hydride, or a gas of an alkyl aluminum hydride and a gas containing silicon onto a substrate of an electron donative surface (A) and a non-electron donative surface (B) to form an Al or Al—Si film only on the electron donative surface (A), and yet after the selective film formation modifying the non-electron donative surface (B) to permit Al or Al—Si to be also deposited thereon, whereby a dense Al or Al—Si film can be formed at high speed.

Still another object of the present invention is to provide a deposited film formation method which can control selective/non-selective deposition by controlling the applied power for plasma formation and therefore can perform embedding within via-hole and deposition onto an insulating layer in one reaction device and yet continuously without change of gas species, and consequently can form an electroconductive film excellent in step coverage and electroconductivity and can form a good film as wiring for semiconductor device such as LSI, etc.

DETAILED DESCRIPTION OF THE PREFERRED EMBODIMENTS

Figure 1A:
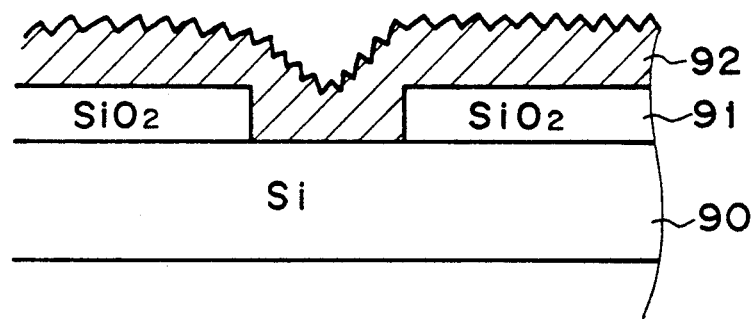
FIGS. 1A and 1B are schematic sectional views for illustration of the Al film formed according to the deposited film formation method of the prior art.
Figure 1B:
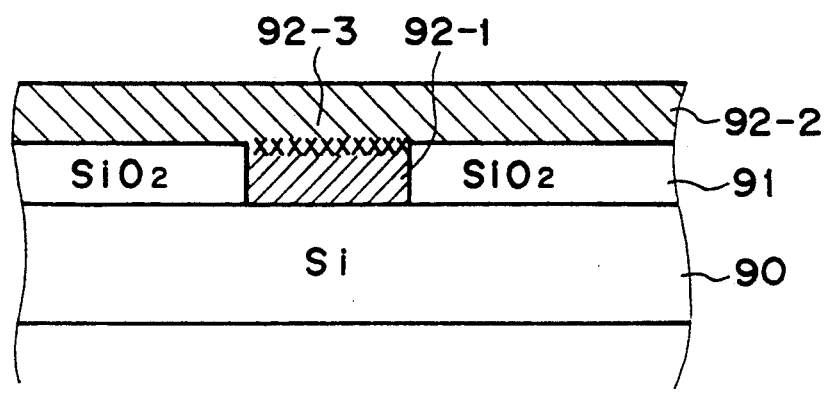

Preferred embodiments according to the present invention are described in detail below, but the present invention is not limited to these embodiments, but any constitution accomplishing the object of the present invention can be employed.

In the present invention, a metal is selectively deposited by utilizing an alkyl aluminum hydride, particularly an alkyl aluminum hydride containing methyl group, and then again the metal is deposited non-selectively.

In the following, prior to detailed description, first, the process for forming a deposited film by use of an organic metal is outlined.

The decomposition reaction of an organic metal, and hence the thin film deposition reaction will vary greatly depending on the kind of the metal atom, the kind of the alkyl bonded to the metal atom, the means of causing the decomposition reaction to occur, the atmospheric gas, etc.

For example, in the case of M-R$_3$ (M: the group III metal, R: alkyl group), trimethyl gallium:

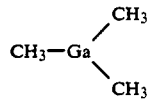

in thermal decomposition undergoes radical cleavage wherein Ga—CH$_3$ bond is cleaved, while triethyl gallium:

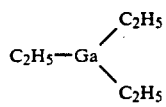

in thermal decomposition is decomposed through β-elimination into:

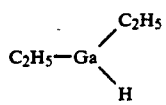

and C$_2$H$_4$. On the other hand, triethyl aluminum attached with the same ethyl group:

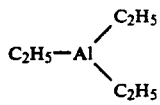

in thermal decomposition undergoes radical decomposition in which Al—C$_2$H$_5$ is cleaved. However, triisobutyl aluminum having iC$_4$H$_9$ bonded therein:

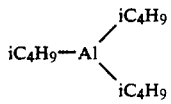

is subject to β-elimination.

Trimethyl aluminum (TMA) comprising $CH_3$ groups and Al has a dimer structure at room temperature:

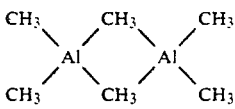

and thermal decomposition is radical decomposition in which Al-$CH_3$ group is cleaved, and at a temperature of 150° C. or lower, it reacts with atmospheric $H_2$ to form $CH_4$, and forms finally Al.

However, at a high temperature of 300° C. or higher, even if $H_2$ may be present in the atmosphere, $CH_3$ group will withdraw H from the TMA molecule, until finally Al—C compound is formed.

Also, in the case of TMA, in light or a certain region controlled in electric power in $H_2$ atmosphere high frequency (ca. 13.56 MHz) plasma, $C_2H_6$ will be formed by the bridging $CH_3$ between two Al's.

In essence, since even an organic metal comprising $CH_3$ group which the simplest alkyl group, $C_2H_5$ group or $iC_4H_9$ group and Al or Ga has a reaction mode depending on the kind of the alkyl group, the kind of the metal atom, the excitation decomposition means, for deposition of a metal atom from an organic metal on a desired substrate, the decomposition reaction must be strictly controlled. For example, when Al is to be deposited from triisobutyl aluminum:

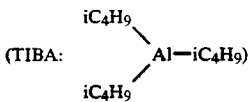

in the low pressure CVD method comprising mainly thermal reaction, unevenness of $\mu m$ order is formed on the surface, whereby the surface morphology is inferior. Also, hillock generation by heat treatment, Si surface roughening through Si diffusion at the interface between Al and Si occur, and also migration resistance is inferior, whereby it can be utilized for ultra-LSI process with difficulty.

For this reason, a method for controlling precisely both the gas temperature and the substrate temperature has been attempted. However, the device is complicated, and the method is of the sheet treatment type in which deposition can be effected only on one wafer by one deposition process. Besides, since the deposition speed is 500 A/min. at the highest, the throughput necessary for bulk production cannot be realized.

Similarly, when TMA is employed, Al deposition has been attempted by use of plasma or light, the device also becomes complicated due to use of plasma or light, and also because of the sheet type device, there remains room for improvement for sufficient improvement of throughput.

Dimethyl aluminum hydride (DMAH) as the alkyl aluminum hydride to be utilized in the present invention is a substance known as alkyl metal, but it could not be estimated at all what Al thin film could be deposited depending on what reaction mode, unless deposited films are formed under all the conditions. For example, in an example of deposition Al by optical CVD from DMAH, the surface morphology is inferior, and the resistivity value was greater than the bulk value (2.7 $\mu ohm.cm$) as several $\mu ohm$ to 10 $\mu ohm\ cm$, thus being inferior in film quality.

Now, referring to the drawings, preferred embodiments of the present invention are described in more detail.

In the present invention, for depositing an Al—Si film of good quality as the electroconductive deposition film on a substrate, the CVD method is used.

More specifically, by use of dimethyl aluminum hydride (DMAH):

Chemical formula: 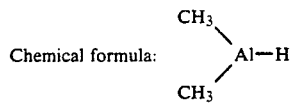

or monomethyl aluminum hydride ($MMAH_2$):

Chemical formula: 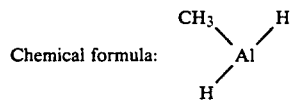

as alkyl aluminum hydride which is an organic metal as a starting gas containing at least one atom which becomes the constituent of the deposited film, optionally together with a gas containing Si atoms as another starting gas, and by use of $H_2$ as the reaction gas, an Al film or a metal film composed mainly of Al is formed by gas phase growth with a gas mixture of these on a substrate.

As the substrate applicable in the present invention, a material having electron donative property may be employed.

The electron donative material is described in detail below.

The electron donative material refers to one having free electrons existing or free electrons intentionally formed in the substrate, for example, a material having a surface on which the chemical reaction is promoted through give-and-take of electrons with the starting gas molecules attached on the substrate surface. For example, generally metals and semiconductors correspond to such material. Those having very thin oxidized film on the metal or semiconductor surface are also included. For, with such thin film, the chemical reaction can occur between the substrate and the attached starting molecules.

Specifically, there may be included semiconductors such as single crystalline silicon, polycrystalline silicon, amorphous silicon, etc., binary system or ternary system or quaternary system III-V compound semiconductors comprising combinations of Ga, In, Al as the group III element and P, As, N as the group V element, or II-IV compound semiconducters, or metals themselves such as tungsten, molybdenum, tantalum, aluminum, titanium, copper, etc., or silicides of the above metals such as tungsten silicide, molybdenum silicide, tantalum silicide, aluminum silicide, titanium silicide, etc., further metals containing either one of the constituent of the above metals such as aluminum silicon, aluminum titanium, aluminum copper, aluminum tantalum, aluminum silicon copper, aluminum silicon titanium, aluminum palladium, titanium nitride, etc.

On the substrate with such constitution, Al is deposited only through simple thermal reaction in the reaction system of the starting gas and $H_2$. For example, the thermal reaction in the reaction system between DMAH and $H_2$ may be basically considered as follows:

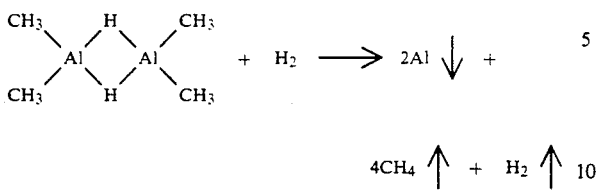

DMAH assumes a dimer structure at room temperature. Also, with $MMAH_2$, a high quality Al film could be formed by thermal reaction as shown below in Examples.

Since $MMAH_2$ has low vapor pressure as 0.01 to 0.1 Torr at room temperature, a large amount of the starting material can be transported with difficulty, and the upper limit value of the deposition speed is several hundred Å/min. in the present embodiment, and preferably, it is most desirable to use DMAH of which vapor pressure is 1 Torr at room temperature.

In another embodiment of the present invention, the CVD method is used for selective deposition of a good Al film or metal film composed mainly of Al as the electroconductive deposition film on the substrate.

More specifically, as described above, by use of dimethyl aluminum hydride (DMAH) or monomethyl alminum hydride ($MMAH_2$), optionally together with a gas containing Si atoms as the starting gas, and by used of $H_2$ as the reaction gas, an Al film or a metal film composed mainly of Al is selectively formed on the substrate by gas phase growth with a gas mixture of these.

The substrate applicable in the present invention has a first substrate surface material for formation of the surface on which Al—Si is deposited, and second substrate surface material on which no metal is deposited. And, as the first substrate surface material, a material having the electron donative surface is used.

In contrast, as the material for forming the surface on which Al or a metal composed mainly of Al is not deposited selectively, namely the material for forming the electron non- donative surface, conventional insulating materials, oxdized silicon formed by thermal oxidation, CVD, etc., glass or oxidized film such as BSG, PSG, BPSG, etc., thermally nitrided film, silicon nitrided film by plasma CVD, low pressure CVD, ECR-CVD method, etc.

Figure 2:
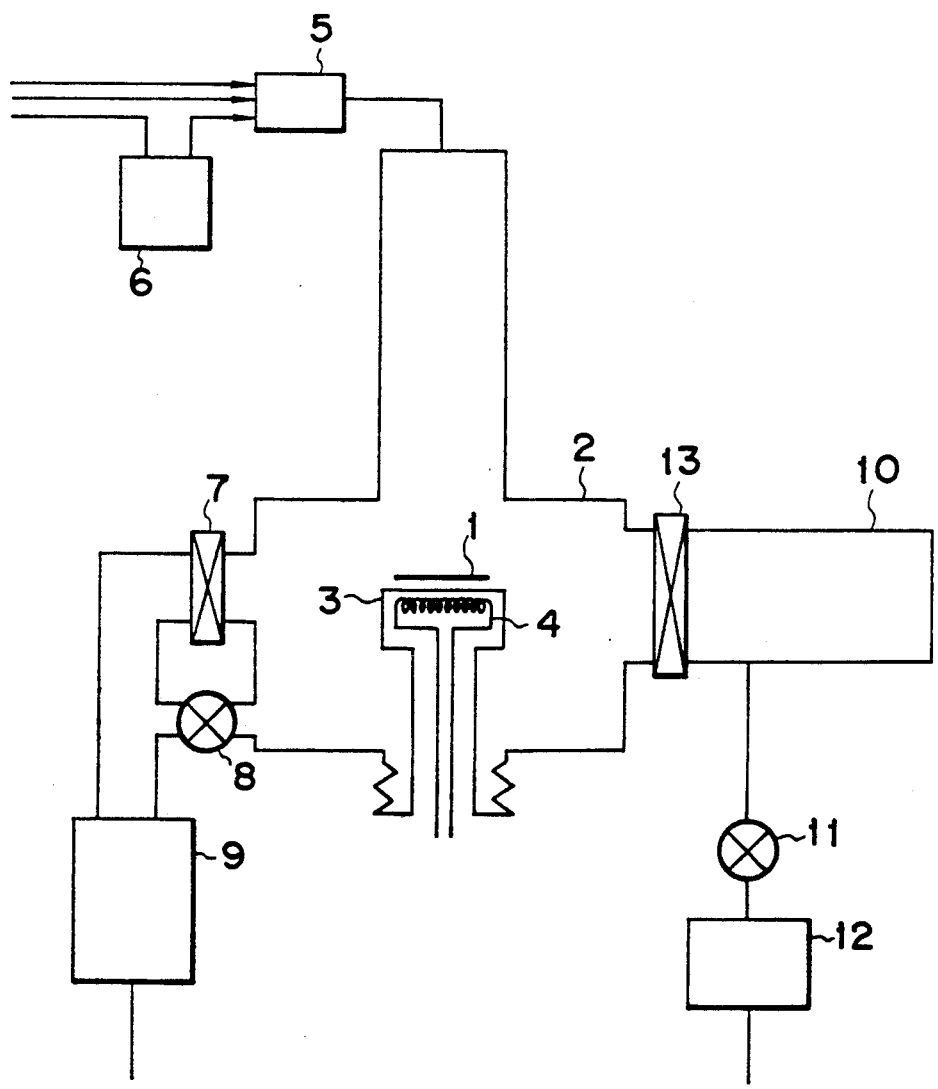
FIGS. 2 and 3 are schematic views showing the deposited film formation device suitable for implementing the deposited film formation method according to the present invention.

FIG. 2 is a schematic view showing a preferable deposition film forming device for applying the present invention.

Here, 1 is a substrate for forming an Al—Si film. The substrate 1 is mounted on a substrate holder 3 provided internally of the reaction tube 2 for forming a space for formation of a deposited film which is substantially closed to FIG. 2. As the material constituting the reaction tube 2, quartz is preferable, but it may be also made of a metal. In this case, it is preferable to cool the reaction tube. The substrate holder 3 is made of a metal, and is provided with a heater 4 so that the substrate mounted thereon can be heated. And, the constitution is made so that the substrate temperature can be controlled by controlling the heat generation temperature of the heater 4.

The feeding system of gases is constituted as described below.

5 is a gas mixer, in which the first starting gas, the second starting gas and the reaction gas are mixed, and the mixture is fed into the reaction tube 2. 6 is a starting gas gasifier provided for gasification of an organic metal as the first starting gas.

The organic metal to be used in the present invention is liquid at room temperature, and is formed into saturated vapor by passing a carrier gas through the liquid of the organic metal within the gasifier 6, which is in turn introduced into the mixer 5.

The evacuation is constituted as described below.

7 is a gate valve, which is opened when performing evacuation of a large volume such as during evacuation internally of the reaction tube 2 before formation of the deposited film. 8 is a slow leak valve, which is used when performing evacuation of a small volume such as in controlling the pressure internally of the reaction tube 2 during formation of the deposited film. 9 is an evacuation unit, which is constituted of a pump for evacuation such as turbo molecular pump, etc.

The conveying system of the substrate 1 is constituted as described below.

10 is a substrate conveying chamber which can house the substrate before and after formation of the deposited film, which is evacuated by opening the valve 11. 12 is an evacuation unit for evacuating the conveying chamber, which is constituted of a pump for evacuation such as turbo molecular pump, etc.

The valve 13 is opened only when the substrate 1 is transferred between the reaction chamber and the conveying space.

As shown in FIG. 2, in the starting gas gasifier 6 which is the gas formation chamber for forming the starting gas, the liquid DMAH maintained at room temperature is bubbled with $H_2$ or Ar (or other inert gas) as the carrier gas to form gaseous DMAH, which is transported to the mixer 5. The $H_2$ gas as the reaction gas is transported through another route into the mixer 5. The gases are controlled in flow rates so that the respective partial pressures may become desired values.

In the case of forming a film by this device, the first starting gas may be of course $MMAH_2$, but DMAH with a vapor pressure enough to become 1 Torr at room temperature is the most preferred. Also, DMAH and $MMAH_2$ may be used in a mixture.

As the second starting gas containing Si which can optionally be used, there can be used $Si_2H_6$, $SiH_4$, $Si_3H_8$, $Si(CH_3)_4$, $SiCl_4$, $SiH_2Cl_2$ and $SiH_3Cl$. Of these compounds $Si_2H_6$ which can be easily decomposed at the low temperature of 200°-300° C. The gases such as $Si_2H_6$ are diluted with $H_2$ or Ar and transported to the mixer 5 through a system other than the DMAH system.

The deposited film formed at a substrate temperature of 160° C. to 450° C. by use of such starting gas and reaction gas, with a thickness of for example 400 Å, has a resistivity at room temperature of 2.7–3.0 μohm.cm which is substantially equal to Al bulk resistivity, and is a continuous and flat film. At this time, the pressure during film formation can be chosen within the range of from $10^{-3}$ Torr to 760 Torr. Also, even when the film thickness may be 1 μm, its resistivity is ca. 2.7–3.0 μohm.cm, and a sufficiently dense film can be formed also with a relatively thicker film. Also, the reflectance in the visible light wavelength region is approximately 80%, whereby a thin film excellent in surface flatness can be deposited.

The substrate temperature is desirably the decomposition temperature of the starting gas containing Al or higher, and 450° C. or lower as described above, but specifically the substrate temperature of 200° to 450° C. is more desirable, and when deposition is carried out under this condition, by making the DMAH partial pressure $10^{-4}$ to $10^{-3}$ Torr, the deposition speed becomes very great as 100 Å/min. to 800 Å/min., whereby sufficient great deposition speed corresponding to the cost as the Al—Si deposition technique for ultra-LSI can be obtained.

A more preferable substrate temperature condition is 270° C. to 350° C., and the metal film deposited under this condition is also strongly orientatable and, even when subjected to the heat treatment at 450° C. for 1 hour, the metal film on the Si monocrystalline or Si polycrystalline substrate becomes a good metal film without generation of hillock, spike as seen in the film forming method of the prior art. Also, such metal film is excellent in electro-migration resistance.

In the device shown in FIG. 2, Al—Si can be deposited on only one sheet of substrate in deposition for one time. Although a deposition speed of ca. 800 Å/min. can be obtained, it is still insufficient for performing deposition of a large number of sheets within a short time.

As the deposition film forming device for improving this point, there is the low pressure CVD device which can deposit a metal by simultaneous mounting of a large number of sheets of wafer. Since the metal film formation according to the present invention utilizes the surface reaction on the electron donative substrate surface, in the hot wall type low pressure CVD method wherein only the substrate is heated, Al can be deposited on the substrate by use of DMAH and $H_2$, optionally together with the Si starting gas such as $Si_2H_6$, etc.

The reaction tube pressure may be 0.05 to 760 Torr, desirably 0.1 to 0.8 Torr, the substrate temperature 160° C. to 450° C., desirably 200° C. to 400° C., the DMAH partial pressure $1 \times 10^{-5}$-fold to $1.3 \times 10^{-3}$-fold of the pressure in the reaction tube, the $Si_2H_6$ partial pressure $1 \times 10^{-7}$-fold to $1 \times 10^{-4}$-fold of the pressure in the reaction tube, and under such conditions, Al—Si can be well deposited on the electron donative substrate.

Figure 3:
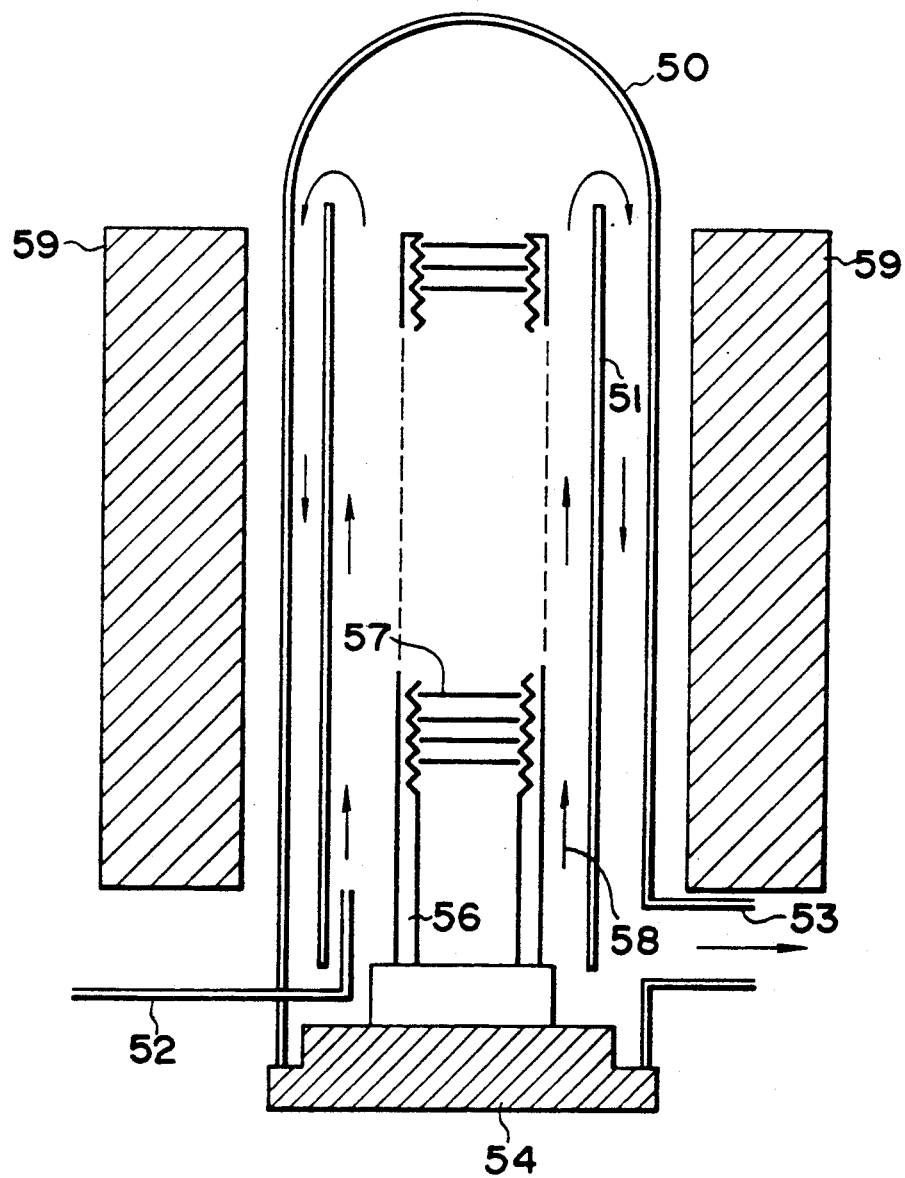

FIG. 3 is a schematic illustration showing a deposited film forming device to which such present invention is applicable.

57 is a substrate for formation of a metal film, 50 is an outside reaction tube made of quartz for forming a space for formation of deposited film substantially closed to the surrounding, 51 an innerside reaction tube made of quartz located for separating the flow of gas within the outside reaction tube 50, 54 a flange made of a metal for opening and closing of the opening of the outside reaction tube 50, and the substrate 57 is located within the substrate holding member 56 provided internally of the innerside reaction tube 51. The substrate holding member 56 should be preferably made of quartz.

Also, in the present device, the substrate temperature can be controlled by the heater portion 59. The pressure internally of the reaction tube 50 is constituted so as to be controllable by the evacuation system connected through the gas evacuation outlet 53.

The gas feeding system is constituted to have a first gas system, a second gas system, a third gas system and a mixer (none are shown in FIG. 2) similarly as the device shown by the symbols 5 and 6 in FIG. 2, and the starting gases and the reaction gas are introduced into the reaction tube 50 through the starting gas inlet 52. These gases react on the surface of the substrate 57 during passage internally of the innerside reaction tube 51 as shown by the arrowhead 58 in FIG. 3 to deposit metal on the substrate surface. The gases after the reaction pass through the gap formed between the innerside reaction tube 51 and the outside reaction tube 50, and evacuated through the gas evacuation outlet 53.

In taking out and in the substrate, the flange 54 made of a metal is permitted to fall by an elevator (not shown) together with the substrate holding member 56 and the substrate 57 to be moved to a predetermined position where the substrate is mounted and detached.

By forming a deposited film under the conditions as described above by use of such device, metal films of good quality can be formed in all the wafers within the device.

As described above, the film obtained according to the film formation process based on the embodiment of the present invention is dense with little content of impurity such as carbon, etc. and resistivity which is similar to bulk, and also has high surface smoothness, and therefore remarkable effects as described below can be obtained.

(1) Reduction of hillock

Hillock is occurrence of concavities on the Al surface due to partial migration of Al when inner stress during film formation is released in the heat treatment step. Also, similar phenomenon occurs by local migration by current passage. The Al film formed by the present invention has little inner stress and is approximate to the state of monocrystal. For this reason, in the heat treatment at 450° C. for one hour, as contrasted to formation of $10^4$–$10^6/cm^2$ of hillocks in the Al film of the prior art, the hillock number could be greatly improved as 0 to $10/cm^2$. Thus, due to substantial absence of Al surface concavity, the resist film thickness and the interlayer insulating film can be made thin to be advantageous for making it finer and more flat.

(2) Improvement of electro-migration resistance

Electro-migration is the phenomenon that the wiring atoms move by passage of a current of high density. By this phenomenon, voids are generated and grown along the grain boundary, whereby as accompanied with reduction of the cross-sectional area, the wiring generates heat to be broken. In the prior art, the anti-migration property has been improved by adding Cu, Ti, etc. to Al to from an alloy. However, the alloy formation results in complication of the etching step and difficulty of minute formation.

Migration resistance is generally evaluated by average wiring life.

The wiring formed by the sputtering method or the CVD method of the prior art has obtained an average wiring life of $1 \times 10^2$ to $10^3$ hours (in the case of a wiring cross-sectional area of 1 $\mu m^2$) under the current passage test conditions of 250° C., $1 \times 10^6$ Å/$cm^2$. In contrast, the Al or Al—Si film obtained by the film formation method based on the embodiment of the present invention could obtain an average wiring life of $10^3$ to $10^4$ hours with a wiring having a cross-sectional area of 1 $\mu m^2$.

Hence, according to the present invention, for example, when the wiring width is 0.8 $\mu m$, a wiring layer thickness of 0.3 $\mu m$ can sufficiently stand practical application. That is, since the wiring layer thickness can be made thinner, unevenness on the semiconductor surface after arrangement of wiring can be suppressed minimum, and also high reliability in passing ordinary current can be obtained. Also, this is possible by a very simple process.

(3) Reduction of alloy pits in contact portion

By the heat treatment in the wiring step, eutectic reaction between Al in the wiring material and Si in the substrate may occur to result in penetration of Al—Si eutectic called as alloy pit into the substrate in spike pattern, thereby destroying shallow junction.

As countermeasure, it is general to employ a material other than pure Al when the depth of junction is 0.3 $\mu$m or more and to employ barrier metal technique of Ti, W, Mo type.

However, there remain some points to be improved such as complication of etching, rise of contact resistivity and the like. In a metal film formed according to the present invention, generation of alloy pits in contact portion with substrate crystal due to heat treatment in the wiring step can be inhibited and wiring with good contact can also be obtained. In other words, wiring can be effected only with a deposited material without destroying junction even when the junction is formed in a depth of about 0.1 $\mu$m.

(4) Improvement of surface smoothness (patterning characteristic improvement of wiring)

In the prior art, roughness of the surface of a metal thin film had inconvenience in the alignment step for the mask and the substrate in the patterning step and in the etching step.

That is, there is unevenness extending to several $\mu$m on the surface of Al film according to the prior art method, whereby the surface morphology is poor, and therefore had the following disadvantages.

1) Alignment signals cause diffused reflection to occur at the surface, whereby noise level becomes higher and inherent alignment signals cannot be discriminated.
2) For covering large surface unevenness, the resist film thickness must be taken large, which is opposite to fine formation.
3) If the surface morphology is poor, halation due to the resist internal reflection will occur locally, whereby resist remaining occurs.
4) If the surface morphology is poor, the side wall becomes notched in the wiring etching step according to its unevenness.

According to the present invention, the surface morphology of metal film to be formed is markedly improved to eliminate all the drawbacks described above.

In other words, in the patterning step, at the line width of the resolving power limit of the exposure machine, the alignment precision 3=0.15 $\mu$m can be accomplished, whereby wiring having smooth side plane is rendered possible without causing halation to occur.

(5) Improvement of resistance in contact hole and through hole and of contact resistance In the prior art method, if the size of the contact hole becomes finer as 1 $\mu$m×1 $\mu$m or less, Si in the wiring is precipitated on the substrate at the contact hole during heat treatment in the wiring step to cover thereover, whereby resistance between the wiring and the element becomes markedly larger.

According to the embodiment of the present invention, since a dense film is formed according to the surface reaction, Al or Al—Si has been confirmed to have a resistivity of 2.7-3.3 $\mu$ohm cm. Also, the contact resistivity can attain $1 \times 10^{-6}$ ohm.cm$^2$ at an area of 0.6 $\mu$m×0.6 $\mu$m when the Si portion has an impurity of $10^{20}$ cm$^{-3}$.

That is, according to the present invention, a good contact with the substrate can be obtained.

(6) It becomes possible to make heat treatment during wiring step lower or abolish the heat treatment step As described in detail above, by applying the present invention to the wiring formation method of a semiconductor integrated circuit, the yield can be improved, and reduction of cost can be promoted to great extent as compared with Al wiring of the prior art.

As described above, according to the CVD method utilizing a gas of an alkyl aluminum hydride, particularly an alkyl aluminum hydride containing methyl group, a metal film for semiconductor integrated circuit device excellent in flatness, migration resistance, electroconductivity, etc. can be formed.

In the following, embodiments of the present invention are described in detail.

FIGS. 4A–4E are schematic views showing the manner of selective growth when DMAH and H$_2$ or DMAH, Si$_2$H$_6$ and H$_2$ are employed.

Figure 4A:
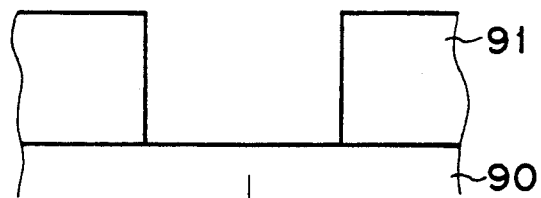
FIGS. 4A-4F are schematic views for illustration of the deposited film formation method according to the present invention.

FIG. 4A illustrates schematically a sectional view of the substrate before formation of Al or Al—Si deposited film. 90 is a substrate comprising electron donative material such as Si wafer. 91 is a thin film comprising a non-electron donative material such as thermally oxidized SiO$_2$ film or CVDBSG film.

Figure 4B:
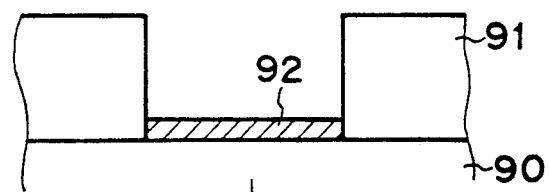

In the case of deposition of an Al—Si film, when DMAH, Si$_2$H$_6$ as the starting material gases and a gas mixture containing H$_2$ as the reactive gas are fed onto the substrate 1 heated within the temperature of the decomposition temperature of DMAH' or higher and 450° C. or lower, Al—Si is precipitated on the substrate 90 to form a continuous film of Al—Si as shown in FIG. 4B.

Figure 4C:
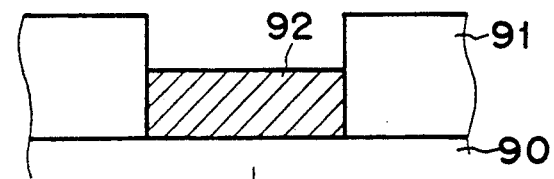
Figure 4D:
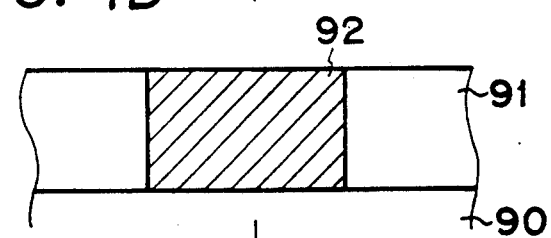

When deposition of Al—Si is continued, via the state shown in FIG. 4C, as shown in FIG. 4D, Al—Si film grows to the level of the uppermost portion of the thin film 91. If it is permitted to further grow, as shown in FIG. 4F, Al—Si film can grow to 5000 Å substantially without growth in the lateral direction. This is the most salient feature of the deposited film by use of DMAH and H$_2$ or DMAH, H$_2$ and Si$_2$H$_6$, and it would be understood that how a film of good quality could be obtained under good selectivity.

And, as the results of analyses by Auger's electron spectrophotometry and photoelectron spectrophotometry, no impurity such as carbon or oxygen is recognized to be mixed in the film.

The resistivity of the deposited film thus formed is 2.7 to 3.0 $\mu\Omega$.cm at room temperature with a film thickness of 400 Å which is substantially equal to the resistivity of Al bulk, and the film becomes continuous and flat. Also, even with a film thickness of 1 $\mu$m, its resistivity is also ca. 2.7 to 3.0 $\mu\Omega$.cm at room temperature. Thus, sufficiently dense film can be also formed for a thick film. The reflectance in the visible wavelength region is also ca. 80%, whereby a thin film excellent in surface flatness can be deposited.

In the multi-layer wiring step as in ultra-LSI, as shown in FIG. 4D, the technique of embedding via-holes selectively with Al or Al—Si of high quality is essentially required. Further, after selective deposition as shown in FIG. 4D, in the same reaction vessel as shown in FIG. 4F, if Al or Al—Si can be deposited on Al or Al—Si which is an electron donative material and a non-electron donative material such as thermally oxidized $SiO_2$ film or CVDBSG film, a multi-layer wiring step of high reliability without occurrence of wiring cutting, etc. at the stepped portion can be realized.

As described in detail above, in selective growth by use of an alkyl aluminum hydride and $H_2$ onto an electron donative surface at a temperature of the decomposition temperature of the alkyl aluminum hydride or higher and 450° C. or lower, because selectivity of Al film is excellent, a method is required for formation of Al film onto the thin film 91. Accordingly, in view of this point, by surface modification of the non-electron donative surface, it becomes possible to form Al film on the non-electron donative surface, on which no Al film could be deposited due to its selectivity before surface modification.

As the method for forming Al film on the non-electron donative surface, there may be included the sputtering method, etc., and of course, by use of the methods as mentioned above. The following point in combination with the sputtering method can be improved: the point is that some procedure is required in realizing low resistance wiring, because during conveyance of the wafer into another sputtering device after the CVD step, the wafer cannot but be exposed to air, whereby a high resistance layer containing oxygen, etc. is formed at the interface between the Al film selectively grown and the Al film formed non-selectively to readily cause increase of contact resistance.

Further, according one of the embodiments of the present invention, Al or Al—Si as shown in FIG. 4F can be also deposited by one CVD device.

The mode of operation of the present invention is as described below. First, by use of DMAH and $H_2$, or DMAH, $Si_2H_6$ and $H_2$, a metal film is deposited so as to embed via-holes as shown in FIGS. 4A to 4E. Then, the non-electron donative surface comprising an insulating film such as silicon oxide, etc. is surface modified practically effectively to make it an electron donative surface. And, on the Al or Al—Si surface having initially an electron donative surface and on the insulating film which becomes an electron donative surface practically effectively by surface modification, Al or Al—Si is deposited homogeneously.

Surface modification is to convert even a non-electron donative surface to the state as if free electrons were present and could contribute to the surface reaction. For example, on $SiO_2$, there is the method in which irradiation of a light having an energy greater than the forbidden band width of $SiO_2$ is effected to form free electrons on the non-electron donative surface. Also, there is the method in which electrons are charged or free electrons are generated by an adequately accelerated electron beam irradiation. It is also possible to generate electrons with unbound arms by cleaving, for example, Si—O bonds existing on the surface by ion irradiation or plasma treatment.

Further, there is the method in which an extremely thin film or a nucleus of Ti or Si is formed on the non-electron donative surface, thereby modifying it to an electron donative surface practically effectively.

Of course, by some means, an extremely very thin film or a nucleus of Al or Al—Si may be also formed to modify the surface to an electron donative surface practically effectively. For example, if a plasma is generated while feeding DMAH and $H_2$, $H_2$ and DMAH are excited or decomposed in the plasma, whereby a nucleus or an extremely thin film is deposited onto the non-electron donative surface. In this case, $H_2$ and DMAH is excited or decomposed by the plasma to become non-electron donative molecules, whereby the reaction may be considered to progress with the starting material molecules (excited or decomposed DMAH molecular species, and excited or ionized $H_2$ molecules and H atoms) themselves, even if there may be no electron contributing to the substrate surface. When the non-electron donative surface is surface modified and deposition of Al begins, Al is deposited continuously.

Among some surface modification methods as described above, in view of crystallinity of Al, the method of forming a nucleus or an extremely thin film of Al or a metal composed mainly of Al may be more preferable than the methods of forming other nuclei or extremely thin films.

The basic film formation procedure of an embodiment utilizing formation of a nucleus or an extremely thin film as the surface modification step is described below.

When a gas mixture containing DMAH and $H_2$ in the case of depositing Al, or DMAH', $Si_2H_6$ and $H_2$ in the case of depositing Al—Si is fed onto the substrate 1 heated to a temperature range of the decomposition temperature of DMAH' or higher and 450° C. or lower, Al—Si is deposited on the substrate 90 to form a continuous film of Al or Al—Si as shown in FIG. 4B.

If deposition of Al or Al—Si is continued under the above conditions, Al or Al—Si film grows via the state shown in FIG. 4C up to the level at the uppermost portion of the thin film 91, as shown in FIG. 4D. The selectively deposited film is a single crystal.

Here, feeding of DMAH of $Si_2H_6$ is stopped to stop deposition of Al or Al—Si. Here, after the "surface modification step" causing the surface reaction to occur onto the heated non-electron donative surface is carried out by introducing the gas as described above, again DMAH and $Si_2H_6$ are fed to deposit Al or Al—Si to such a shape as shown in FIG. 4F.

As the substrate temperature, the decomposition temperature of the starting gas containing Al or higher, and 450° C. or lower are desirable as mentioned above, but specifically a substrate temperature of 200° to 450° C. is desirable, and when deposition is effected under the condition, the deposition rate is very large as 100 Å/min. to 800 Å/min. when the pressure within the reaction vessel is $10^{-3}$ to 760 Torr, and the DMAH partial pressure is $1.5 \times 10^{-5}$ to $1.3 \times 10^{-3}$-fold of the pressure within the reaction vessel, whereby a sufficiently large deposition rate as the Al—Si deposition technique for ultra-LSI can be obtained.

More preferably, the substrate temperature is 270° C. to 350° C., and the Al—Si film deposited under the condition is also strongly orientatable, and the Al—Si film on an Si single crystalline or Si polycrystalline substrate becomes an Al—Si film of good quality without generation of hillock, spike even when subjected to heat treatment at 450° C. for one hour. Also, such Al—Si film is excellent in electromigration resistance.

The surface modification step here is to form an extremely thin film or nucleus of Ti, Si, etc. which is electron donative onto the non-electron donative surface by feeding a gas of $TiCl_4$, $Si_2H_6$, $SiH_4$, $SiCl_4$, $SiHCl_3$, $SiH_2Cl_2$, etc. Specifically, by feeding $TiCl_4$, $Si_2H_6$, $SiH_4$, $SiCl_4$, $SiHCl_3$, $SiH_2Cl_2$ at the same substrate temperature as during deposition of Al or Al—Si under a partial pressure of $10^{-4}$ to 1 Torr, the non-electron donative surface becomes an electron donative surface practically effectively, whereby deposition as shown in FIG. 4F becomes possible. An extremely thin film of a metal which is electron donative may be also formed on the non-electron donative surface.

Figure 5:
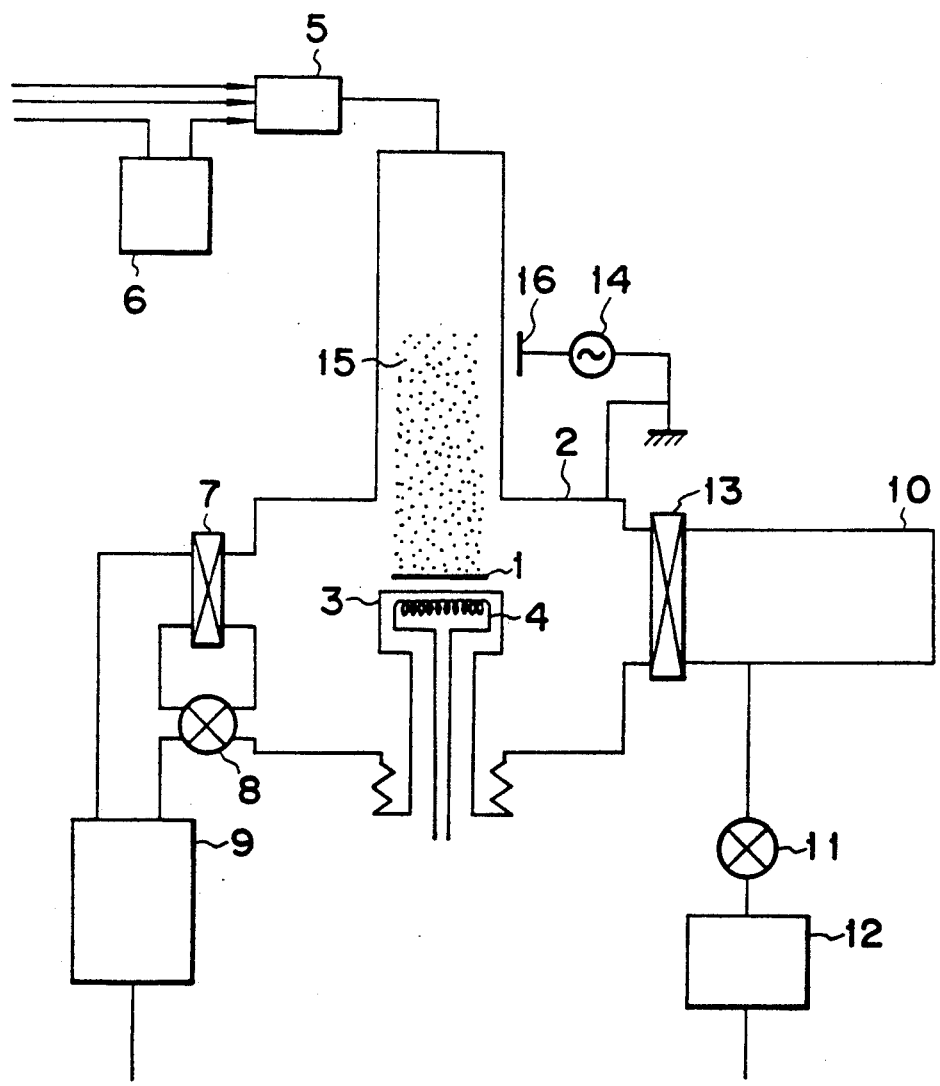
FIGS. 5, 6 and 7 are schematic views showing the deposited film formation device suitable for implementing the deposited film formation method according to the present invention.

As the surface modification step, there is, for example, the method by use of charged particles such as plasma, etc. utilizing the deposited film formation device shown in FIG. 5. Next, the basic film formation procedure of an embodiment utilizing this surface modification step is described.

FIG. 5 is a schematic view showing an example of the deposited film formation device to which the present invention is applicable. The difference from FIG. 2 is provision of the electrode 16 as the plasma forming means.

The electrode 16 is used when generating a plasma for effecting surface modification. A high frequency of ca. 13.6 MHz is applied from the power source 14 on the electrode 16 to form a plasma.

When a plasma is employed, Ar or $H_2$ plasma can be employed, and an $H_2$ plasma wherein reactive particles such as hydrogen ion, hydrogen radicals, etc. exist is preferable. Surface modification is possible under a reaction tube pressure of 0.1 to 5 Torr, and a plasma power of 0.1 to 1 $W/cm^3$. Desirably, it is 0.2 to 0.5 $W/cm^3$.

Figure 4E:
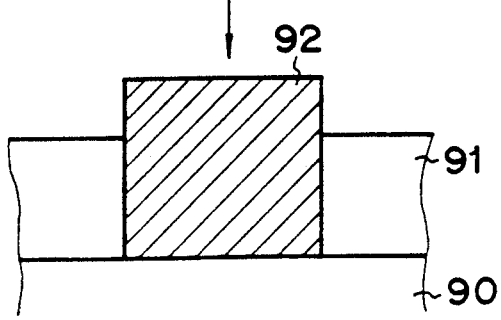
Figure 4F:
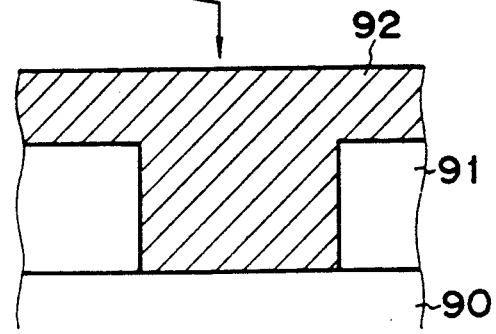

By feeding the above-mentioned $TiCl_4$, $Si_2H_6$, $SiH_4$, $SiCl_4$, $SiHCl_3$, $SiH_2Cl_2$ at the same substrate temperature as during deposition of Al or Al—Si under a partial pressure of $10^{-4}$ to 1 Torr, the non-electron donative surface becomes an electron donative surface practically effectively, whereby deposition as shown in FIG. 4E becomes possible.

When DMAH+$H_2$ is used for formation of an extremely thin film of a metal which is electron donative on a non-electron donative surface, carbon will be mixed therein, but it is also possible to use the method in which the substrate temperature is elevated momentarily to a temperature of 450° C. or higher.

Figure 6:
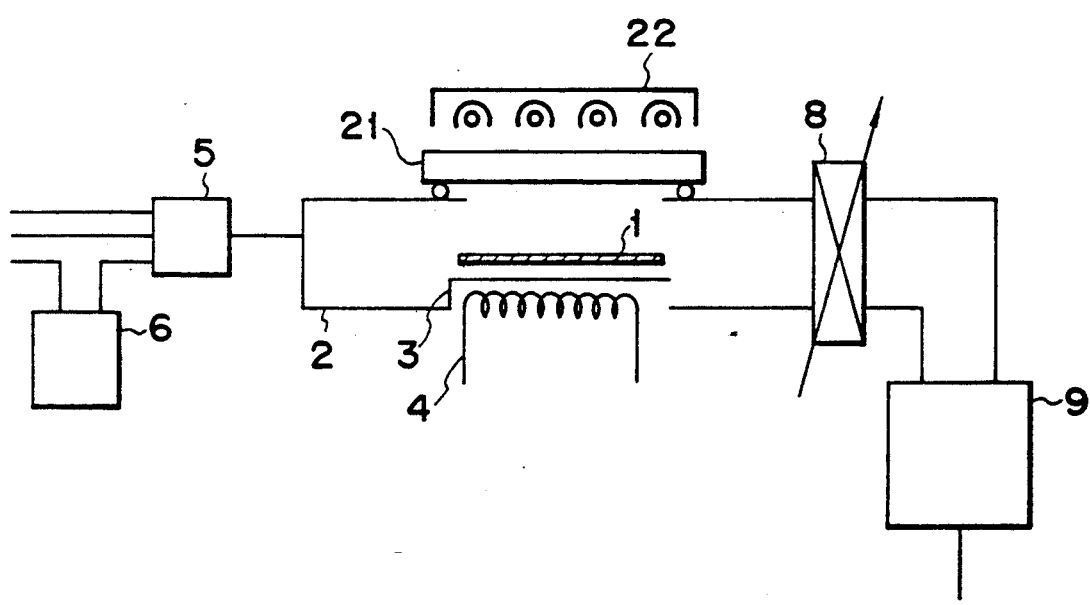

FIG. 6 is a schematic view of the device which can form an Al—C extremely thin film or nucleus by heating momentarily the substrate temperature to a substrate temperature of 450° C. to 550° C. only during surface modification step, for example, so as to obtain a temperature elevation of 100° C./min., and feeding DMAH and $H_2$. The portions having the same function as in FIG. 6 are affixed with the same numerals. 21 is a light transmissive window, which is a glass made of quartz. 22 is a lamp for momentarily heating. Xe lamp, Hg-He lamp, W lamp may be employed. Laser, etc. may be also employed, but a lamp is preferable for uniform and momentarily heating.

The substrate is conveyed in the vertical direction to the paper surface (conveying chamber not shown).

Figure 7:
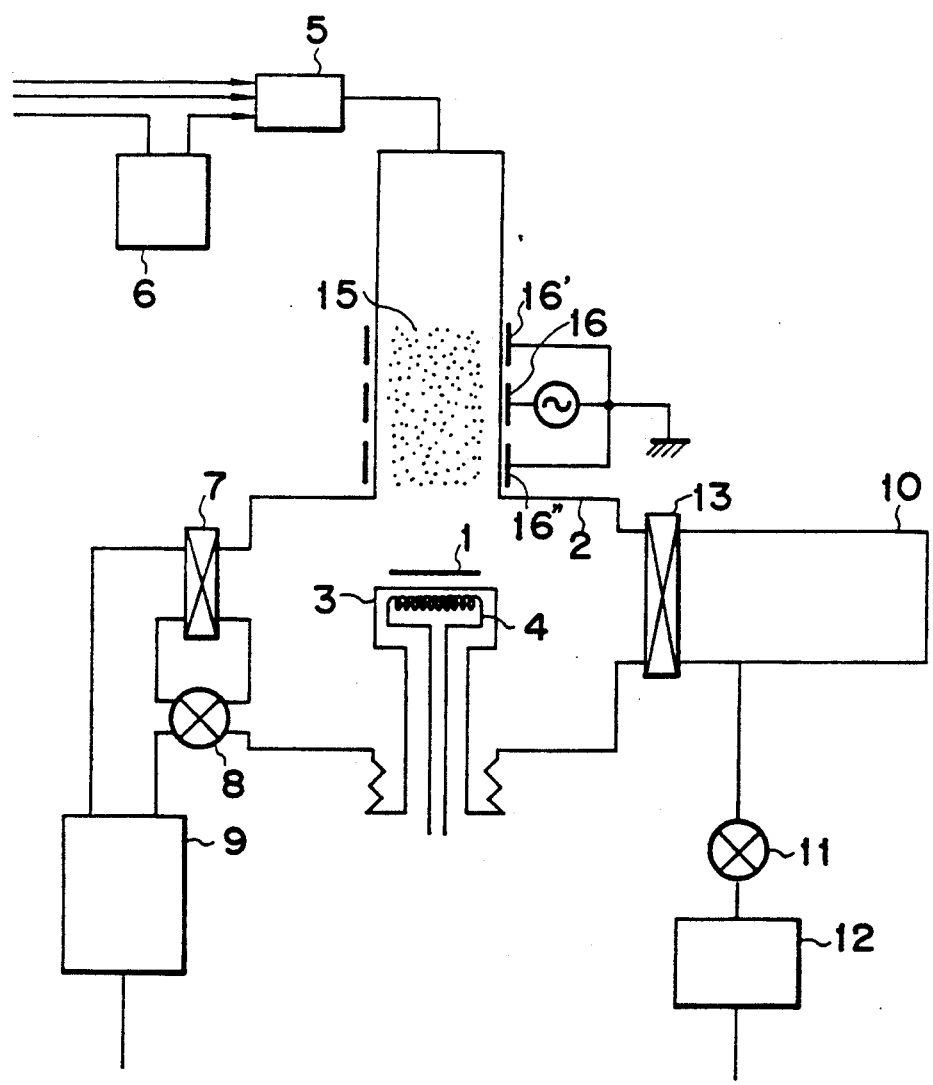

In the surface modification step, there is also the method in which DMAH molecules or $H_2$ molecules are excited and decomposed by use of a plasma into electron donative molecules to form a nucleus or extremely thin layer of Al or Al—Si onto the non-electron donative substrate surface. FIG. 7 is a schematic view showing an example of the deposited film formation device to which the present invention is applicable.

The difference from FIG. 5 is the point that earth electrodes 16' and 16" are provided in addition to the excitation electrode 16 as the plasma generation electrode. During the surface modification step, a plasma is formed by applying a high frequency power of ca. 13.56 MHz on the electrode 16. Since the excitation electrode 16 is sandwiched between the earth electrodes 16' and 16", the electric line of force terminates at the earth electrodes 16' and 16", whereby the plasma will not contact the substrate 1. After selectively depositing Al or Al—Si on the electron donative surface on the substrate having the electron donative surface and the non-electron donative surface, a plasma is generated while feeding DMAH and $H_2$ or DMAH, $H_2$ and $Si_2H_6$ as such. In the plasma, DMAH is excited and decomposed to become electron donative molecules to form an Al or Al—Si nucleus of extremely thin film onto the non-electron donative surface. After formation of Al nucleus, plasma is stopped and deposition is continued.

Since the partial pressure of DMAH during Al deposition is at most $5\times 10^{-3}$-fold relative to the reactive gas $H_2$, the properties of the plasma are extremely similar to those of $H_2$ plasma. If the plasma power is great, DMAH will be more excited and decomposed than necessary, whereby carbon will be mixed in the Al or Al—Si formed in the surface modification step. On the other hand, if the plasma power is too small, no DMAH is excited and decomposed, whereby no nucleus or extremely thin film of Al or Al—Si is formed. When Ar is employed as the carrier gas, carbon is mixed in the nucleus or extremely thin film of Al or Al—Si formed in the surface modification step, and therefore it is desirable to use $H_2$ as the carrier gas. The reaction tube pressure during surface modification may be 0.1 to 5 Torr, the applied plasma power 0.02 to 0.4 $W/cm^3$ in the device shown in FIG. 5, and the surface modification time 10 sec. or longer.

At an applied plasma force of ca. 0.02 $W/cm^3$ or lower, no Al or Al—Si nucleus or extremely thin film can be formed to effect no surface modification. The plasma force for surface modification should be desirably 0.02 to 0.06 $W/cm^3$. After modification of the non-electron donative surface, Al is deposited non-selectively on the electron donative surface and the non-electron donative surface. At this time, no carbon is detected at the interface between the Al or Al—Si selectively deposited and the Al or Al—Si non-selectively deposited.

After the surface modification step, deposition may be also continued without stopping of plasma. The Al or Al—Si film quality deposited by application of plasma as such is found to be substantially of the same kind as the deposited without application of plasma. However, since it is slightly inferior in surface flatness, it is desirable to apply plasma only during surface modification. The plasma power density applied during surface modification is smaller than the plasma power used in general plasma CVD or reactive ion etching, and substantially no deposited product onto the reaction tube surface will be formed.

In the device shown in FIG. 7, a high frequency power source of 13.56 MHz is used for plasma generation, but discharging of direct current or frequency for commercial use or microwave (e.g. 2.45 GHz) may be also used.

However, for direct current discharging, electrodes must be provided within the reaction chamber. On the other hand, when microwave is employed, a waveguide is required. Therefore, if simplification of the device constitution is desired, utilization of high frequency of 13.56 MHz which requires only provision of external electrodes is preferable.

The film obtained by the Al or Al—Si film formation method based on the present invention has such characteristics that it is dense, the content of impurities such as carbon, etc. is also extremely small, the resistivity is similar to that of bulk, and also it has high surface flatness. Additionally, it has the marked effects as shown below:

(1) reduction of hillock generation during heat treatment,
(2) improvement of electromigration resistance,
(3) reduction of alloy pit at the contact portion,
(4) improvement of wiring patterning characteristic through surface smoothness improvement,
(5) improvement of resistance within via-hole and contact resistance,
(6) lowered temperature of heat treatment during wiring step.

According to the method shown by the present invention, even on a substrate in which an electron donative material and a non-electron donative material are included therein having an unevenness of μm order, sub-micron order, first a deposited film can be formed selectively at the concavity, and thereafter a uniform Al film can be formed on the whole substrate surface within the same film forming device.

In the multi-layer wiring formation step of ultra-LSI, reduction of film thickness of the metal thin film at the uneven portion lowers reliability of the wiring formation step, but according to the Al film or Al—Si film deposition method of the present invention, there is no film thickness reduction, etc. at the uneven portion, whereby Al, Al—Si film of high reliability can be formed.

In the sputtering method of the prior art, because film formation onto uneven portion can be done with difficulty, at the opening cross-sectional portion of an insulating film, the step of forming a slope according to such a method as reflow by high temperature heat treatment has been required.

However, provision of a slope onto the opening requires unnecessary area, which is a step contradictory to fine formation technique.

According to the present invention, the cross-section embed Al or Al—Si is embedded in via-hole whose cross-section is vertical, and also the Al film formed thereafter is excellent in flatness, and therefore the present method is ideal as the wiring metal deposition of finely formed ultra-LSI.

EXAMPLE 1

The procedure of Al film formation was as described below.

By use of the device shown in FIG. 2, the reaction tube 2 was internally evacuated to ca. $1 \times 10^{-8}$ Torr by an evacuation equipment 9. However, film formation of Al was possible, even if the vacuum degree within the reaction tube 2 may be worse than $1 \times 10^{-8}$ Torr.

After washing of Si wafer, Si wafer was mounted in the conveying chamber 10 by releasing the conveying chamber 10 to atmospheric pressure. After evacuation of the conveying chamber to ca. $1 \times 10^{-6}$ Torr, the gate valve 13 was opened and the wafer was mounted on the wafer holder 3.

After the wafer was mounted on the wafer holder 3, the gate valve 13 was closed, and the reaction chamber 2 was evacuated to a vacuum degree of ca. $1 \times 10^{-8}$ Torr.

In this Example, DMAH was fed through the first gas line. As the carrier gas through the DMAH line, $H_2$ was employed. The second gas line was for $H_2$.

By permitting $H_2$ to flow through the second gas line, the opening of the slow leak valve 8 was controlled to adjust the pressure within the reaction tube 2 to a predetermined value. A typical pressure in this Example was made ca. 1.5 Torr. Then, the water was heated by current passage through the heater 4. After the wafer temperature has reached a predetermined temperature, DMAH was introduced into the reaction tube through the DMAH line. The total pressure was ca. 1.5 Torr, and the DMAH pressure was made ca. $1.5 \times 10^{-4}$ Torr. When DMAH was introduced into the reaction tube 2, Al was deposited.

After elapse of a predetermined deposition time, feeding of DMAH was once stopped. The predetermined deposition time of the first Al film deposited in this process was the time until the thickness of the Al film on Si becomes equal to the film thickness of $SiO_2$. This time, if the deposition rate was previously calculated, can be determined by the method in which the deposition time was set on the basis of the data.

While maintaining constantly the substrate temperature, $TiCl_4$ was introduced into the reaction vessel 2. The time for introducing $TiCl_4$ was ca. 10 minutes. The step of introducing $TiCl_4$ was the surface modification step. Feeding of $TiCl_4$ was stopped, and again DMAH was fed. By feeding of DMAH, Al was deposited on the Al film already deposited and the $SiO_2$ film. After elapse of a predetermined deposition time, feeding of DMAH was stopped. The Al film deposited in this process was called the second Al film.

In the above-described sample, in a temperature range of 160° C. to 450° C., in the first Al film deposition step, no Al was deposited on $SiO_2$, but Al with the same film thickness as $SiO_2$ was deposited only at the portion where Si was exposed, while in the second Al film deposition step, Al was deposited at substantially the same deposition rate on the first Al film and $SiO_2$. Next, heating by the heater 4 was stopped to cool the wafer. After feeding of $H_2$ gas was stopped and the reaction vessel internally evacuated, the wafer was conveyed to the conveying chamber, and only the conveying chamber was made atmospheric, and then the wafer was taken out. The outline of the Al film formation was as described above.

Next, the sample of which film was formed according to this Example is described.

An Si substrate (n type, 1 to 2 Ω cm) was subjected to thermal oxidation at a temperature of 1000° C. according to the hydrogen combustion system ($H_2$: 4 liter/M, $O_2$: 2 liter/M).

The film thickness was found to be 7000 Å ± 500 Å, and the refractive index 1.46. A photoresist was coated on the whole surface of the Si substrate, and a pattern as described below was baked by an exposure machine. Said pattern was such that various pores of 0.25 μm × 0.25 μm to 100 μm × 100 μm were opened. After developing of the photoresist, the subbing $SiO_2$ was etched by reaction ion etching (RIE), etc. with the photoresist as the mask to have partially the substrate Si exposed. Thus, 130 sheets of samples having pores of SiO₂ with various sizes of 0.25 μm × 0.25 μm to 100 μm × 100 μm were prepared.

And, by setting the substrate temperature at 13 levels, Al was deposited according to the procedure as described above for 10 sheets of samples at the respective substrate temperatures.

The respective conditions for the first Al film deposition step, the surface modification step and the second Al film deposition step were made as follows:

| during the first Al film deposition step. | |
| --- | --- |
| total pressure | 1.5 Torr |
| DMAH partial pressure | $1.5 \times 10^{-4}$ Torr |
| during surface modification step, | |
| TiCl₄ partial pressure | 0.1 Torr |
| during the second Al film deposition step. | |
| total pressure | 1.5 Torr |
| DMAH partial pressure | $1.5 \times 10^{-4}$ Torr |

The Al films deposited by varying the substrate temperature at 13 levels were evaluated by use of various evaluation methods. The results are shown in Table 1.

In the above samples, at a temperature range of 160° C. to 450° C., Al was deposited in the first Al deposition step selectively only at the Si exposed portion with the same thickness as SiO₂. This film was found to be a single crystal. Further, in the second Al deposition step, Al was deposited at the same deposition rate on both of the SiO₂ surface and the Al film deposited in the first deposition step.

Both of the Al film selectively deposited on Si and the Al film deposited on SiO₂ after the surface modification step were of good quality with respect to resistivity, reflectance, hillock generation density after the heat treatment step, etc.

Also, substantially no increase of resistance occurred at the interface between the first Al film and the second Al film.

Even when the TiCl₄ partial pressure was varied from 0.05 to 0.5 Torr, there was substantially no difference in deposition rate and the film quality of Al film.

EXAMPLE 2

According to the same procedure as in Example 1, Al film was deposited by introducing Si₂H₆ at a partial pressure of 0.1 to 50 Torr in place of TiCl₄ during the surface modification step.

In the first Al deposition step, only at the Si exposed portion, Al film with the same thickness as SiO₂ was deposited, and when the substrate temperature during the surface modification step of 200° C. to 450° C. and the Si₂H₆ partial pressure of 0.1 to 50 Torr, in the second Al deposition step, Al was deposited at the same deposition rate both on SiO₂ and on the first Al film.

The film quality of the Al film deposited was found to be good similarly as in Example 1.

EXAMPLE 3

According to the same procedure as in Example 1, Al film was deposited by introducing SiCl₄, SiHCl₃ or SiH₂Cl₂ at a partial pressure of 0.1 to 50 Torr in place of TiCl₄ during the surface modification step.

In the first Al deposition step, only at the Si exposed portion, Al film with the same thickness as SiO₂ was deposited, and when the substrate temperature during the surface modification step was 200° C. to 450° C. and the partial pressure of SiCl₄, SiHCl₃ or SiH₂Cl₂ of 0.1 to 50 Torr, in the second Al deposition step, Al was deposited at the same deposition rate both on SiO₂ and on the first Al film.

The film quality of the Al film deposited was found to be good similarly as in Example 1.

EXAMPLE 4

According to the same procedure as in Examples 1, 2 and 3 except for using Ar in place of H₂ as the carrier gas, Al was deposited on the Si substrate with the patterned SiO₂ thin film. The preparation method of the substrate was the same as that shown in Example 1. The deposited Al films all gave the same results as in Examples 1, 2 and 3.

EXAMPLE 5

Al films were formed on the substrates with the constitutions as described below (Samples 5-1 to 5-179) by means of the low pressure CVD device shown in FIG. 3.

PREPARATION OF SAMPLE 5-1

On a single crystalline silicon as the first substrate surface material which was electron donative, a thermally oxidized SiO₂ film as the second substrate surface material which was non-electron donative was formed, followed by patterning according to the photolithographic steps as shown in Example 1, to have the single crystalline silicon surface partially exposed.

The film thickness of the thermally oxidized SiO₂ film was found to be 7000 Å, and the size of the exposed portion, namely the opening of the single crystalline silicon 3 μm × 3 μm. Thus, Sample 5-1 was prepared. (Hereinafter such sample was represented as "thermally oxidized SiO₂ (hereinafter abbreviated as T-SiO₂)/single crystalline silicon").

PREPARATION OF SAMPLES 5-2 to 5-179

Sample 5-2 was an oxidized film formed by normal pressure CVD (hereinafter abbreviated as SiO₂)/single crystalline silicon;

Sample 5-3 was a boron doped oxidized film formed by normal pressure CVD (hereinafter abbreviated as BSG)/single crystalline silicon;

Sample 5-4 was a phosphorus doped oxidized film formed by normal pressure CVD (hereinafter abbreviated as PSG)/single crystalline silicon;

Sample 5-5 was a phosphorus and boron doped oxidized film formed by normal pressure CVD (hereinafer abbreviated as BSPG)/single crystal silicon;

Sample 5-6 was a nitrified film formed by plasma CVD (hereinafter abbreviated as P-SiN)/single crystalline silicon;

Sample 5-7 was a thermally nitrified film (hereinafter abbreviated as T-SiN)/single silicon;

Sample 5-8 was a nitrified film formed by low pressure DCVD (hereinafter abbreviated as LP-SiN)/single crystalline silicon;

Sample 5-9 was a nitrified film formed by ECR device (hereinafter abbreviated as ECR-SiN)/single crystalline silicon.

Further, according to combinations of the first substrate surface material which was electron donative and the second substrate surface material which was non-electron donative, Samples 5-11 to 5-179 shown in Table 2 were prepared.

In Table 2, as the first substrate surface material were employed single crystalline silicon (single crystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminumsilicon (Al—Si), titaniumaluminum (Al—Ti), titanium nitride (Ti—N), copper (Cu), aluminumsiliconcopper (Al—Si—Cu), aluminumpalladium (Al—Pd), titanium (Ti), molybdenum silicide (Mo—Si), tantalum silicide (Ta—Si). These samples were placed in the low pressure CVD device, and Al films were formed within the same batch. Al was deposited under the following deposition conditions:

| during the first Al film formation step. | |
|---|---|
| reaction tube pressure: | 0.3 Torr |
| DMAH partial pressure: | $3 \times 10^{-5}$ Torr |
| substrate temperature: | 300° C. |
| during surface modification step. | |
| TiCl$_4$ partial pressure: | 0.4 Torr |
| during the second Al film formation step: | |
| reaction tube pressure: | 0.3 Torr |
| DMAH partial pressure: | $3 \times 10^{-5}$ Torr |
| Substrate temperature: | 300° C. |

Under the above conditions, in the first Al deposition step, no Al was deposited on the non-electron donative surface, but Al with the same thickness as the non-electron donative film was deposited only at the portion where the electron donative surface was exposed, while in the second Al film deposition step after the surface modification step, Al was deposited at substantially the same deposition rate on the first Al film and the non-electron donative surface.

The film quality of the Al film deposited was found to be very good, exhibiting the same properties of that at the substrate temperature 300° C. shown in Example 1.

EXAMPLE 6

According to the same procedure as in Example 5, Al film was deposited by introducing Si$_2$H$_6$ at a partial pressure of 0.1 to 50 Torr in place of TiCl$_4$ during the surface modification step.

When the substrate temperature during the surface modification step of 200° C. to 400° C. and the Si$_2$H$_6$ partial pressure of 0.1 to 50 Torr, in the second Al deposition step, Al was deposited at the same deposition rate both on the first Al film and on the non-electron donative material.

The film quality of the Al film deposited was found to be good similarly as in Example 1.

EXAMPLE 7

According to the same procedure as in Example 5, Al film was deposited by introducing SiCl$_4$, SiHCl$_3$ or SiH$_2$Cl$_2$ at a partial pressure of 0.1 to 50 Torr in place of TiCl$_4$ during the surface modification step.

In the first Al deposition step, only at the electron donative material exposed portion, Al film with the same thickness as the non-electron donative material was deposited, and when the substrate temperature during the surface modification step of 200° C. to 450° C. and the partial pressure of SiCl$_4$, SiHCl$_3$ or SiH$_2$Cl$_2$ of 0.1 to 50 Torr, in the second Al deposition step, Al was deposited at the same deposition rate both on the non-electron donative material and on the first Al film.

The film quality of the Al film deposited was found to be good similarly as in Example 1.

EXAMPLE 8

According to the same procedure as in Example 1, Al deposition was carried out by use of MMAH$_2$ in place of DMAH in the first Al deposition step and the second Al deposition step.

The deposition conditions and the surface modification step were as follows:

| during the first Al film formation step. | |
|---|---|
| reaction tube pressure: | 1.5 Torr |
| MMAH$_2$ partial pressure: | $5 \times 10^{-4}$ Torr |
| during surface modification step, | |
| TiCl$_4$ partial pressure | 0.1 Torr |
| during the second Al film formation step: | |
| reaction tube pressure: | 1.5 Torr |
| MMAH$_2$ partial pressure: | $5 \times 10^{-4}$ Torr |

In the above samples, within a temperature range of 160° C. to 400° C., Al was deposited with the same thickness as SiO$_2$ selectively at only the Si exposed portion in the first Al deposition step, while in the second Al deposition step, Al was deposited at the same deposition rate on both the SiO$_2$ surface and the Al film deposited in the first deposition step.

The same results were also obtained when Si$_2$H$_6$, SiCl$_4$, SiHCl$_3$ or SiH$_2$Cl$_2$ was fed at a partial pressure of 0.1 to 50 Torr in place of TiCl$_4$ during the surface modification step.

EXAMPLE 9

By use of the device in FIG. 4, Al deposition was carried out. The device in FIG. 4 was a device shown in FIG. 2 which was provided with the electrode 13 for plasma generation and the power source 14 for plasma generation. When high frequency power was applied on the plasma generation electrode 13 from the power source 14, a plasma (shown by broken line) was generated within the reaction tube 2.

According to the same procedure as in Example 1, the surface modification was carried out only under the conditions of the surface modification step of:

| H$_2$ total pressure: | 1.0 Torr |
|---|---|
| plasma power: | 0.3 W/cm$^3$ | to effect Al deposition. The substrate employed was the Si wafer with the patterned SiO$_2$ thin film prepared according to the same procedure as shown in Example 1.

At a temperature range of 160° C. to 450° C., in the first Al deposition step, Al was deposited with the same thickness as SiO$_2$ selectively only at the Si exposed portion, while in the second Al deposition step, Al was deposited at the same deposition rate both on the SiO$_2$ surface and on the Al film deposited in the first deposition step.

There was no difference in film quality with respect to resistivity, reflectance, hillock generation density after the heat treatment step, etc. between the Al film selectively deposited and the Al film deposited on SiO$_2$ after the surface modification step.

Also, no increase of resistance occurred at the interface between the first Al film and the second Al film.

Even when the conditions in the surface modification step were varied with H$_2$ pressure from 0.1 to 2 Torr and the plasma power from 0.2 to 1 W/cm$^3$, there was no difference in deposition rate and film quality of the Al film.

EXAMPLE 10

By use of the device shown in FIG. 5, Al deposition was carried out. In the device in FIG. 5, the substrate 1 can be heated by a heater 4, and can be heated by a lamp 22 to further higher temperature. For the lamp, Xe lamp was used. 21 was a light transmissive window, which was made of quartz.

In FIG. 5, the conveying chamber was mounted in the vertical direction to the paper surface (not shown). The deposition procedure was as described below.

The substrate holder was mounted on the wafer holder 3, $H_2$ gas was introduced under a pressure of 1.5 Torr into the reaction vessel 2, and then heated by current passage through the heater 4. After it became a predetermined temperature, DMAH was introduced into the reaction vessel 2 to form a first Al film.

After elapse of a predetermined deposition time, feeding only of DMAH was stopped. The wafer was quickly heated by the lamp 22. After the substrate surface temperature became 500° C., again DMAH was introduced into the reaction vessel for 0.1 to 5 minutes. Again feeding of DMAH was stopped, the lamp 22 extinguished and the substrate temperature dropped to a predetermined temperature.

The surface modification step was as described above, and thereafter again DMAH was introduced to deposit a second Al film. After completion of a predetermined deposition time, feeding of DMAH was stopped and also current passage thorugh the heater was stopped, followed by cooling.

Al film was deposited under the following conditions:

| during the first Al film formation step, | |
|---|---|
| total pressure | 1.5 Torr |
| DMAH partial pressure | $1.5 \times 10^{-4}$ Torr |
| during the surface modification step, | |
| substrate temperature | 500° C. |
| total pressure | 1.5 Torr |
| DMAH partial pressure | $1.5 \times 10^{-5}$ Torr |
| during the second Al film formation, | |
| total pressure | 1.5 Torr |
| DMAH partial pressure | $1.5 \times 10^{-4}$ Torr. |

The substrate employed was an Si wafer with the patterned $SiO_2$ thin film used in Example 1.

At a temperature range of 160° C. to 450° C., in the first Al deposition step, Al was deposited with the same thickness as $SiO_2$ selectively only at the Si exposed portion, while in the second Al deposition step, Al was deposited at the same deposition rate both on the $SiO_2$ surface and on the Al film deposited in the first deposition step.

By SIMS analysis, etc., presence of C was confirmed only at the interface between the first Al film and the second Al film, but there was no increase of resistance at the interface between the first Al film and the second Al film. The film quality of the deposited Al film was found to be substantially the same as in Table 1.

EXAMPLE 11

According to the same procedure as in Example 1, $Si_2H_6$ was added through the third gas line during transportation of DMAH to the reaction tube, and Al—Si deposition was carried out.

The respective conditions for the first Al—Si film deposition step, the surface modification step and the second Al—Si film deposition step were made as follows:

| during the first Al—Si film deposition step. | |
|---|---|
| total pressure | 1.5 Torr |
| DMAH partial pressure | $1.5 \times 10^{-4}$ Torr |
| $Si_2H_6$ partial pressure | $2 \times 10^{-6}$ Torr |
| during the surface modification step, | |
| $TiCl_4$ partial pressure | 0.1 Torr |
| during the second Al—Si film deposition step. | |
| total pressure | 1.5 Torr |
| DMAH partial pressure | $1.5 \times 10^{-4}$ Torr |
| $Si_2H_6$ partial pressure | $2 \times 10^{-6}$ Torr |

At a temperature range of 160° C. to 450° C. Al—Si was deposited in the first Al deposition step selectively only at the Si exposed portion with the same thickness as $SiO_2$, while in the second Al deposition step, Al—Si was deposited at the same deposition rate on both of the $SiO_2$ surface and the Al—Si film deposited in the first deposition step.

Both of the Al—Si film selectively deposited on Si and the Al—Si film deposited on $SiO_2$ after the surface modification step were not different in film quality with respect to resistivity, reflectance, hillock generation density after the heat treatment step, etc.

Also, substantially no increase of resistance occurred at the interface between the first Al—Si film and the second Al—Si film.

Even when the $TiCl_4$ partial pressure was varied from 0.05 to 0.5 Torr, there was substantially no difference in deposition rate, the film quality of Al—Si film.

EXAMPLE 12

According to the same procedure as in Example 11, Al—Si film was deposited by introducing $Si_2H_6$, $SiCl_4$, $SiHCl_3$ or $SiH_2Cl_2$ at a total pressure of 0.1 to 50 Torr in place of $TiCl_4$ during the surface modification step.

The respective conditions for the first Al—Si film deposition step, the surface modification step and the second Al—Si film deposition step were as follows:

| during the first Al—Si film formation step, | |
|---|---|
| total pressure | 1.5 Torr |
| DMAH partial pressure | $1.5 \times 10^{-4}$ Torr |
| $Si_2H_6$ partial pressure | $2 \times 10^{-6}$ Torr |
| during the surface modification step, | |
| partial pressure of $Si_2H_6$, $SiCl_4$, $SiHCl_3$ or $SiH_2C_2$ | 0.1–50 Torr |
| during the second Al—Si film deposition step, | |
| total pressure | 1.5 Torr |
| DMAH partial pressure | $1.5 \times 10^{-4}$ Torr |
| $Si_2H_6$ partial pressure | $2 \times 10^{-6}$ Torr |

In the case of using $Si_2H_6$ in the surface modification step, Al—Si was deposited in the first Al deposition stpe selectively only at the Si exposed portion with the same thickness as $SiO_2$, and when the substrate temperature during the surface modification step was 200° C. to 450° C., and the $Si_2H_6$ partial pressure was greater than the partial pressure during Al—Si deposition as 0.1 to 50 Torr, in the second Al deposition step, Al—Si was deposited at the same deposition rate on both of the $SiO_2$ surface and the Al—Si film deposited in the first deposition step.

The film quality of the Al—Si film deposited was found to be good similarly as in the case of Example 1.

On the other hand, in the case of $SiCl_4$, $SiHCl_3$ or $SiH_2Cl_2$, Al—Si was deposited in the first Al deposition step selectively only at the Si exposed portion with the same thickness as $SiO_2$, and when the substrate temperature during the surface modification step was 200° C. to 450° C., and the partial pressure of $SiCl_4$, $SiHCl_3$ or $SiH_2Cl_3$ was greater than the partial pressure during Al—Si deposition as 0.1 to 50 Torr, in the second Al deposition step, Al—Si was deposited at the same deposition rate on both of the $SiO_2$ surface and the Al—Si film deposited in the first deposition step.

The film quality of the Al—Si film deposited was found to be good similarly as in the case of Example 1.

EXAMPLE 13

According to the same procedures as in Example 11 and Example 12, Al—Si films were deposited by varying the $Si_2H_6$ partial pressure during Al—Si film deposition.

The respective conditions for the first Al—Si film deposition step, the surface modification step and the second Al—Si film deposition step were as follows:

| the first Al—Si film formation step. | |
| --- | --- |
| total pressure | 1.5 Torr |
| DMAH partial pressure | $1.5 \times 10^{-4}$ Torr |
| $Si_2H_6$ partial pressure | $1.5 \times 10^{-7}$ - $1 \times 10^{-4}$ Torr |
| substrate temperature | 300° C. |
| the surface modification step, | |
| partial pressure of $Si_2H_6$, $SiCl_4$, $SiHCl_3$ or $SiH_2Cl_2$ | 0.1–50 Torr, or |
| partial pressure of $TiCl_4$ | 0.05–0.5 Torr |
| substrate temperature | 300° C. |
| the second Al—Si film deposition step. | |
| total pressure | 1.5 Torr |
| DMAH partial pressure | $1.5 \times 10^{-4}$ Torr |
| $Si_2H_6$ partial pressure | $0.05 \times 0.5$ torr |
| substrate temperature | 300° C. | deposition and during the second Al—Si deposition.

In either case of using $TiCl_4$, $Si_2H_6$, $SiCl_4$, $SiHCl_3$ or $SiH_2Cl_2$, in the first Al deposition step Al—Si was deposited selectively only at the Si exposed portion with the same thickness as $SiO_2$, and while in the second Al—Si deposition step, Al—Si was deposited at the same deposition rate on both of the $SiO_2$ surface and the Al—Si film deposited in the first deposition step.

The Si content (wt. %) of the Al—Si film formed at this time was varied from 0.005% to 5% in substantially proportion to the $Si_2H_6$ partial pressure simultaneously transported with DMAH.

EXAMPLE 14

During the first Al—Si deposition step and the second Al—Si deposition step of Example 11 and Example 12, the carrier gas for DMAH transport was changed from $H_2$ to Ar. Following otherwise entirely the same procedure, Al—Si was deposited.

During the first Al—Si deposition and during the second Al—Si deposition, $H_2$ was fed from the second gas line.

Similarly in this Example, Al—Si deposited films could be formed as in Example 11 and Example 12.

EXAMPLE 15

Al—Si was deposited according to entirely the same procedure as in Example 13, except for changing the carrier gas for DMAH transport from $H_2$ to Ar during the first Al—Si deposition step and during the second Al—Si deposition step.

During the first Al—Si deposition and during the second Al—Si deposition, $H_2$ was fed from the second gas line.

Similarly in this Example, Al—Si deposited films could be formed as in Example 13.

EXAMPLE 16

According to the same procedure as in Example 5, Example 6 and Example 7, Al—Si deposition was carried out with addition of $Si_2H_6$ in the first Al—Si film deposition step and the second Al—Si deposition step.

| The deposition conditions were as follows: | |
| --- | --- |
| the first Al film formation step. | |
| reaction tube pressure | 0.3 Torr |
| DMAH partial pressure | $3 \times 10^{-5}$ Torr |
| substrate temperature | 300° C. |
| $Si_2H_6$ partial pressure | $1.5 \times 10^{-6}$ Torr |
| the surface modification step. | |
| $TiCl_4$ partial pressure | 0.05–5 Torr, or |
| $Si_2H_6$ partial pressure | 0.1 to 50 Torr, or |
| $SiCl_4$ partial pressure | 0.1 to 50 Torr, or |
| $SiHCl_3$ partial pressure | 0.1 to 50 Torr, or |
| $SiH_2Cl_2$ partial pressure | 0.1 to 50 Torr |
| the second Al film deposition step, | |
| reaction tube pressure | 0.3 Torr |
| DMAH partial pressure | $3 \times 10^{-5}$ Torr |
| $Si_2H_6$ partial pressure | $1 \times 10^{-6}$ Torr |
| substrate temperature | 300° C. |

Under the above conditions, in the first Al—Si film deposition step, no Al—Si was deposited on the non-electron donative surface, but Al—Si was deposited only at the exposed portion of the electron donative surface with the same thickness as the non-electron donative film, while in the second Al—Si film deposition step following the surface modification step, Al—Si was deposited on both the first Al—Si film and the non-electron donative surface at substantially the same deposition rate.

The film quality of the Al—Si film deposited was found excellent, exhibiting the same properties as those prepared at the substrate temperature 300° C. shown in Example 1.

EXAMPLE 17

According to the same procedure as in Example 1, except for using $MMAH_2$ in place of DMAH in the first Al—Si deposition step and the second Al—Si deposition step, with $Si_2H_6$ fed simultaneously with $MMAH_2$ to the reaction tube, Al—Si deposition was carried out.

The deposition conditions and the surface modification step were as follows:

| the first Al—Si film formation step, | |
| --- | --- |
| total pressure | 1.5 Torr |
| $MMAH_2$ partial pressure | $5 \times 10^{-4}$ Torr |
| $Si_2H_6$ partial pressure | $1 \times 10^{-5}$ Torr |
| the surface modification step, | |
| $TiCl_4$ partial pressure | 0.1 Torr |
| the second Al—Si film deposition step. | |
| total pressure | 1.5 Torr |
| $MMAH_2$ partial pressure | $5 \times 10^{-4}$ Torr |
| $Si_2H_6$ partial pressure | $1 \times 10^{-5}$ Torr |

In the above samples, within a temperature range of 160° C. to 400° C., Al—Si was selectively deposited with the same thickness as $SiO_2$ at only the Si exposed portion in the first Al—Si deposition step, while in the second Al—Si deposition step, Al was deposited on both the $SiO_2$ surface and the Al film deposited in the first deposition step at the same deposition rate.

The same results were also obtained when $Si_2H_6$, $SiCl_4$, $SiHCl_3$ or $SiH_2Cl_2$ was fed at a partial pressure of 0.1 to 50 Torr in place of $TiCl_4$ in the surface modification step.

EXAMPLE 18

According to the same procedures as in Example 11 and Example 12, Al—Si was deposited using $SiH_4$ in place of $Si_2H_6$ added during transportation of DMAH Deposition was carried out at a $SiH_4$ partial pressure of $1 \times 10^{-5}$ Torr where DMAH partial pressure was $1.5 \times 10^{-4}$ Torr.

Deposition of Al—Si was found the same as in Example 11 and Example 12.

EXAMPLE 19

According to the same procedure as in Example 9, Al—Si deposition was carried out transporting $Si_2H_6$ concurrently with the transportation of DMAH.

In the first Al—Si deposition step and the second Al—Si deposition step, deposition was carried out under a reaction tube pressure of 1.5 Torr, a DMAH partial pressure of $1.5 \times 10^{-5}$ Torr and an $Si_2H_6$ partial pressure of $2 \times 10^{-6}$ Torr.

In the temperature range of 160° C. to 450° C., Al—Si was selectively deposited in the first Al deposition step only at the Si exposed portion with the same thickness as $SiO_2$, while in the second Al deposition step, Al—Si was deposited at the same deposition rate on both of the $SiO_2$ surface and the Al—Si film deposited in the first deposition step.

Both the Al—Si film selectively deposited on Si and the Al—Si film deposited on $SiO_2$ following the surface modification step were not different in film quality with respect to resistivity, reflectance, hillock generation density after the heat treatment step, etc.

Also, substantially no increase of resistance occurred at the interface between the first Al—Si film and the second Al—Si film.

Even when the $H_2$ pressure was changed to 0.1-2 Torr, and the plasma power to 0.2-1 $W/cm^3$, there was substantially no difference in the deposition rate or the film quality of Al—Si film.

EXAMPLE 20

According to the same procedure as in Example 10, Al—Si deposition was carried out transporting $Si_2H_6$ concurrently with DMAH in the first Al—Si deposition step and the second Al—Si deposition step.

| The deposition conditions were as follows: | |
| --- | --- |
| the first Al film formation step, | |
| total pressure | 1.5 Torr |
| DMAH partial pressure | $1.5 \times 10^{-4}$ Torr |
| $Si_2H_6$ partial pressure | $1.0 \times 10^{-6}$ Torr |
| the surface modification step. | |
| substrate temperature | 500° C. |
| total pressure | 1.5 Torr |
| DMAH partial pressure | $1.5 \times 10^{-5}$ Torr |
| the second Al—Si film deposition step. | |
| total pressure | 1.5 Torr |
| *-continued* | |
| The deposition conditions were as follows: | |
| DMAH partial pressure | $1.5 \times 10^{-4}$ Torr |
| $Si_2H_6$ partial pressure | $1 \times 10^{-6}$ Torr |

The substrate employed was an Si wafer patterned with the $SiO_2$ thin film used in Example 1. In the temperature range of 160° C. to 450° C., in the first Al—Si deposition step, no Al—Si was deposited on $SiO_2$, but Al—Si was deposited only at the Si exposed portion to the same thickness as $SiO_2$, while in the second Al—Si deposition step, Al—Si was deposited at the same deposition rate both on the first Al—Si film and $SiO_2$.

By SIMS analysis, etc., presence of C was confirmed only at the interface between the first Al film and the second Al film, but there was no increase of resistance at the interface between the first Al film and the second Al film. The film quality of the deposited Al film was found to be substantially the same as shown in Table 1.

EXAMPLE 21

By means of the CVD device shown in FIG. 6, Al was deposited on the same Si substrate with patterning of $SiO_2$ as in Example 1. The deposition procedure was initiated by mounting the Si substrate on a wafer holder as in Example 1, followed by heating of the substrate under a desired $H_2$ pressure. Subsequently, after reaching a desired substrate temperature, DMAH was fed to deposit Al selectively only at the Si exposed surface which is an electron donative surface. The Al deposited in this process was called the first Al. After elapse of a predetermined time, while maintaining the total pressure and the DMAH pressure constant a plasma was generated. After elapse of a predetermined time, the plasma was stopped, and further Al was deposited. At this point, Al was deposited non-selectively both on the Al selectively deposited and the $SiO_2$ which was a non-electron donative surface. The Al film deposited non-selectively was called the second Al. After elapse of a predetermined time, feeding of DMAH was stopped to complete deposition. The deposition time of the first Al film was the time necessary for the film thickness of the selectively deposited Al film to become equal to the thickness of $SiO_2$.

In this Example, DMAH was fed through the first gas line. For the carrier gas of DMAH line, $H_2$ was employed. The second gas line was for $H_2$.

The respective conditions for the first Al film deposition step, the surface modification step, the second Al film deposition step were as follows:

| the first Al film deposition step: | |
| --- | --- |
| total pressure | 0.1, 1.2, 5 Torr |
| DMAH partial pressure | $1 \times 10^{-3}$-fold of total pressure |
| the surface modification step: | |
| total pressure, DMAH partial pressure: | |
| the same as in the first Al film deposition step | |
| plasma power density: ($W/cm^3$) | 0.01, 0.015, 0.02, 0.03, 0.04, 0.06, 0.07, 0.08, 0.10, 0.20, 0.40 |
| plasma application time: | 1 min. |
| the second Al film deposition step: | |
| total pressure and DMAH partial pressure: the same as in the first Al film | |

-continued deposition step.

For every combination of the total pressure (3 kinds) and the plasma application power (11 kinds), Al film deposition was carried out respectively at 13 levels of the substrate temperature from 150° C. to 470° C. The first Al film selectively deposited was monocrystalline. The film quality of the Al deposited film was the same as shown in Table 1. The results of carbon measurement at the interface between the first Al film and the second film were shown in Table 3. At a substrate temperature of 150° C., no film was deposited on the substrate. When the plasma application power density during the surface modification step was 0.01 or 0.015 W/cm$^3$, no Al film was deposited on the SiO$_2$ surface, irrespective of the substrate temperature. When the plasma application power density during the surface modification step was 0.08 W/cm$^3$ or more, carbon was detected at the interface between the first Al film and the second Al film, and the contact resistance at the interface between the first film and the second Al film was higher than in the case of plasma power density of 0.02–0.07 W/cm$^3$.

EXAMPLE 22

According to the same procedure as in Example 21, Al deposition was carried out. The deposition conditions during surface modification were the same as in Example 21 except for plasma application time. Al deposition was carried out with plasma application time of 10 seconds, 30 seconds, 3 minutes, 5 minutes and 10 minutes.

When the plasma application time was 10 seconds, 30 seconds, or 3 minutes, the film quality obtained was the same as shown in Table 1, Table 3. When the plasma application time was 5 minutes or 10 minutes, the film quality other than surface reflectance was the same as shown in Table 1, Table 3, but surface reflectance was worse than the value shown in Table 1, being approximately 65 to 75% when the substrate temperature was 160°–350° C.

EXAMPLE 23

According to the procedure of Example 21, Al deposition was carried out. The deposition conditions during the first Al film deposition step, the surface modification step and the second Al film deposition step were the same as in Example 21 except for DMAH partial pressure. The DMAH partial pressure was made $1 \times 10^{-5}$, $5 \times 10^{-5}$, $1 \times 10^{-4}$ and $5 \times 10^{-4}$-fold of the total pressure.

The film quality of the obtained film was found the same as shown in Table 1 and Table 3. The obtained film quality did not depend on the DMAH partial pressure.

EXAMPLE 24

According to the same procedure as in Example 21, Al deposition was carried out. The difference from Example 21 was the use of Ar for the carrier gas of the DMAH line in the device shown in FIG. 6. The deposition conditions other than carrier gas were the same as in Example 21.

The film quality of the obtained Al film was the same as shown in Table 1. When the plasma power density during the surface modification step was 0.01 to 0.015 W/cm$^3$, no Al film was formed on SiO$_2$. When the plasma power density was 0.02 W/cm$^3$ or more, the second Al film was deposited on SiO$_2$, but carbon was detected in trace amount by SIMS analysis at the interface between the first Al film and the second Al film. The resistance value was sufficiently small.

EXAMPLE 25

Al deposition was carried out according to the same procedure as in Example 24. The deposition conditions other than plasma application time during surface modification were the same as in Example 24. Al deposition was carried out for plasma application time of 10 seconds, 30 seconds, 3 minutes, 5 minutes and 10 minutes.

When the plasma application time was 10 seconds, 30 seconds or 3 minutes, the film quality obtained the same as in Table 1. When the plasma application time was 5 minutes or 10 minutes, the film quality other than surface reflectance was the same as shown in Table 1 and Table 3, but surface reflectance was inferior to the value shown in Table 1, about 65 to 75%, when the substrate temperature was 160°–350° C. Not depending on the plasma application time, when the plasma power density was 0.02 W/cm$^3$ or more, the second Al film was also deposited on SiO$_2$, but carbon was detected in trace amount by SIMS analysis at the interface between the first Al film and the second Al film. However, resistance was sufficiently small.

EXAMPLE 26

According to the same procedure as in Example 24, Al deposition was carried out. The deposition conditions during the first Al film deposition step, the surface modification step and the second Al film deposition step were the same as in Example 24 except for DMAH partial pressure. The DMAH partial pressure was made $1 \times 10^{-5}$, $5 \times 10^{-5}$, $1 \times 10^{-4}$ and $5 \times 10^{-4}$-fold of the total pressure.

The film quality of the film obtained was found to be the same as shown in Table 1. When the plasma power density during the surface modification step was 0.01 or 0.015 W/cm$^3$, no Al film was formed on SiO$_2$. When the plasma power density was 0.02 W/cm$^3$ or more, the second Al film was also deposited on SiO$_2$, but carbon was detected in trace amount by SIMS analysis at the interface between the first Al film and the second Al film. However, resistance was sufficiently small.

EXAMPLE 27

According to the same procedures, and under the conditions as in Examples 21, 22, 23, 24, 25, 26, Al film deposition was carried out for various substrates shown in Example 5 (samples 5-1 to 5-179).

In the first Al film deposition step, Al film was selectively deposited only on the electron donative surface, but no Al film on the non-electron donative surface. In the second Al film deposition step following the surface modification step, Al film was deposited at substantially the same rate on the first Al film and the non-electron donative surface. The film quality of the Al film deposited was found as good as those in Examples 21, 22, 23, 24, 25, 26.

EXAMPLE 28

By use of the CVD device shown in FIG. 6, Al was deposited on the Si substrate with SiO$_2$ patterning as in Example 1. According to the same deposition procedure as in Example 21, DMAH was transported to a reaction tube, and $Si_2H_6$ was added from the third gas line to effect Al—Si deposition.

In this Example, DMAH was fed from the first gas line. For the carrier gas of DMAH line, $H_2$ was employed. The second gas line was for $H_2$. The third gas line was for $Si_2H_6$.

The respective conditions for the first Al—Si film deposition step, the surface modification step and the second Al—Si film deposition step were as follows:

| the first Al—Si film deposition step: | |
| --- | --- |
| total pressure: | 0.1, 1.2, 5 Torr |
| DMAH partial pressure: | $1 \times 10^{-3}$-fold of total pressure |
| $Si_2H_6$ partial pressure: | 0.01-fold of DMAH partial pressure |
| the surface modification step: | |
| total pressure, DMAH partial pressure, $Si_2H_6$ partial pressure: the same as in the first Al—Si film deposition step | |
| plasma power density: (W/cm³) | 0.01, 0.015, 0.02, 0.03, 0.04, 0.06, 0.07, 0.08, 0.10 0.2, 0.4 |
| plasma application time: | 1 min. |
| the second Al—Si film deposition step: | |
| total pressure, DMAH partial pressure, $Si_2H_6$ partial pressure: the same as in the first Al—Si film deposition step. | |

For every combination of the total pressure (3 kinds) and the plasma application power (11 kinds), Al—Si film deposition was carried respectively at 13 levels of the substrate temperature from 150° C. to 470° C. The film quality of the deposited Al—Si film was the same as shown in Table 1, and measurement results of carbon at the interface between the first Al film and the second Al—Si film were the same as shown in Table 3. At a substrate temperature of 150° C., no film was deposited on the substrate. When the plasma application power density during the surface modification step was 0.01 or 0.015 W/cm³, no Al—Si film was deposited on the $SiO_2$ surface irrespectively of the substrate temperature. When the plasma application power density during the surface modification step was 0.08 W/cm³ or more, carbon was detected at the interface between the first Al—Si film and the second Al—Si film and the contact resistance at the interface between the first Al—Si film and the second Al—Si film was higher than in the case of plasma power density of 0.02 to 0.07 W/cm³.

EXAMPLE 29

According to the same procedure as in Example 28, Al—Si deposition was carried out varying the $Si_2H_6$ partial pressure in the first Al—Si film deposition step and the second Al—Si film deposition step.

The respective conditions for the first Al—Si film deposition step, the surface modification step, the second Al—Si film deposition step were as follows:

| the first Al—Si film deposition step: | |
| --- | --- |
| total pressure: | 0.1, 1.2, 5 Torr |
| DMAH partial pressure: | $1 \times 10^{-3}$-fold of total pressure |
| $Si_2H_6$ partial pressure: | $1 \times 10^{-3}$ to 1-fold of DMAH partial pressure |
| the surface modification step: | |
| total pressure, DMAH partial pressure, | |
| $Si_2H_6$ partial pressure: the same as in the first Al—Si film deposition step | |
| plasma power density: (W/cm³) | 0.01, 0.015, 0.02, 0.03, 0.04, 0.06, 0.07, 0.08, 0.10 0.2, 0.4 |
| plasma application time: | 1 min. |
| the second Al—Si film deposition step: | |
| total pressure, DMAH partial pressure, $Si_2H_6$ partial pressure: the same as in the first Al—Si film deposition step. | |

For every combination of the total pressure (3 kinds) and the plasma application power (11 kinds), Al—Si film deposition was carried out respectively at 13 levels of the substrate temperature from 150° C. to 470° C. varying the $Si_2H_6$ partial pressure. In the first Al—Si film deposition step, Al—Si was selectively deposited only at the Si surface exposed portion, and in the second Al—Si film deposition step, Al—Si film was deposited at substantially the same deposition rate both on the first Al—Si film and $SiO_2$. The Si content of the deposited Al—Si film was substantially proportion to the $Si_2H_6$ partial pressure added, varying from 0.005% to 5%. The film quality of the Al—Si film deposited was found as good as that in the case of Example 21.

EXAMPLE 30

Al—Si deposition was carried out according to the same procedure as in Example 28.

The deposition conditions other than plasma application time during surface modification were the same as in Example 28. Al—Si deposition was carried out with plasma application time of 10 seconds, 30 seconds, 3 minutes, 5 minutes and 10 minutes.

When the plasma application time was 10 seconds, 30 seconds or 3 minutes, the film quality obtained was the same as shown in Table 1 and Table 3. When the plasma application time was 5 minutes or 10 minutes the film quality other than surface reflectance was the same as shown in Table 1 and Table 3, but the surface reflectance was inferior to the value shown in Table 1, about 65 to 75%, when the substrate temperature was between 160° and 350° C.

EXAMPLE 31

According to the same procedure as in Example 28, Al—Si deposition was carried out.

The deposition conditions except for DMAH partial pressure and $Si_2H_6$ partial pressure during the first Al—Si film deposition step, the surface modification step, the second Al—Si film deposition step were the same as in Example 21. The DMAH partial pressure was made $1 \times 10^{-5}$, $1 \times 10^{-4}$ and $5 \times 10^{-4}$-fold of the total pressure. The $Si_2H_6$ partial pressure was 0.01-fold of the DMAH partial pressure.

The film quality of the deposited Al—Si film was found as good as that in the case of Example 21.

EXAMPLE 32

According to the same procedure as in Example 28, Al—Si deposition was carried out. The difference from Example 28 was the use of Ar for the carrier gas of DMAH in the device shown in FIG. 6. The deposition conditions except for carrier gas were the same as in Example 28.

The film quality of the obtained Al—Si film was found as good as in Table 1. When the plasma power density during the surface modification step was 0.01 or 0.015 W/cm$^3$, no Al—Si film was formed on SiO$_2$. When the plasma power density was 0.02 W/cm$^3$ or more, the second Al—Si film was deposited on SiO$_2$, but carbon was detected in trace amount by SIMS analysis at the interface between the first Al—Si film and the second Al—Si film. However, resistance was sufficiently small.

EXAMPLE 33

Al—Si deposition was carried out according to the same procedure as in Example 29. The deposition conditions except for plasma application time during surface modification were the same as in Example 24. Al—Si deposition was carried out with plasma application time of 10 seconds, 30 seconds, 3 minutes, 5 minutes and 10 minutes.

When the plasma application time was 10 seconds, 30 seconds or 3 minutes, the film quality obtained was the same as shown in Table 1. When the plasma application time was 5 minutes or 10 minutes, the film quality other than surface reflectance was the same as in Table 1, Table 3, but surface reflectance was worse than the value shown in Table 1, being about 65 to 75%, when the substrate temperature was 160° to 350° C. Not depending on the plasma application time, when the plasma power density was 0.02 W/cm$^3$ or higher, the second Al—Si film was deposited also on SiO$_2$, but carbon was detected in trace amount by SIMS analysis at the interface between the first Al—Si film and the second Al—Si film. However, resistance was sufficiently small.

EXAMPLE 34

According to the same procedure as in Example 28, Al—Si deposition was carried out.

The deposition conditions except for DMAH partial pressure during the first Al—Si film deposition step, the surface modification step and the second Al—Si film deposition step were the same as in Example 28. The DMAH partial pressure was made $1 \times 10^{-5}$, $5 \times 10^{-5}$, $1 \times 10^{-4}$, $5 \times 10^{-4}$-fold of the total pressure. The Si$_2$H$_6$ partial pressure was $1 \times 10^{-3}$-fold of the DMAH partial pressure.

The film quality of the Al—Sl film deposited was found to be good similarly as in Table 1. When, the plasma power density during the surface modification step was 0.01, 0.015 W/cm$^3$, no Al—Si film was formed on SiO$_2$. When the plasma power density was 0.02 W/cm$^3$ or higher, the second Al—Si film was deposited on SiO$_2$, but carbon was detected in trace amount by SIMS analysis at the interface between the first Al—Si film and the second Al—Si film. However, resistance was sufficiently small.

EXAMPLE 35

According to the same procedures, and under the conditions as in Examples 28, 29, 30, 31, 32, 33 and 34, Al—Si film deposition was carried out for various substrates shown in Example 5 (samples 5-1 to 5-179 shown in Table 2).

In the first Al—Si film deposition step, Al—Si film was selectively deposited only on the electron donative surface, but no Al—Si film on the non-electron donative surface. In the second Al—Si film deposition step after the surface modification stpe, Al—Si film was deposited at substantially the same rate on the first Al—Si film and the non-electron donative surface. The film quality of the Al—Si film deposited was found to be good similarly as in Examples 28, 29, 30, 31, 32, 33 and 34.

EXAMPLE 36

By means of the CVD device shown in FIG. 6, Al was deposited on an Si substrate with patterning of SiO$_2$.

The preparation method of the Si substrate with patterning of SiO$_2$ was similar to the case of Example 1.

First, Al deposition procedure was described.

After washing of an Si wafer, the conveying chamber 10 was released to atmospheric pressure, and the Si wafer was mounted in the conveying chamber. The conveying chamber was evacuated to ca. $1 \times 10^{-6}$ Torr, then the gate valve 13 was opened and the wafer was mounted on a wafer holder 3. After mounting of the wafer on the wafer holder 3, the gate valve 13 was closed, and the reaction chamber 2 was evacuated to a vacuum degree of ca. $1 \times 10^{-8}$ Torr. However, Al can be deposited even if the reaction chamber cannot be evacuated to a vacuum degree of $1 \times 10^{-8}$ Torr.

In this Example, DMAH was fed through the first gas line. For the carrier gas of the DMAH line, H$_2$ was employed. The second gas line was for H$_2$.

Through the second gas line was flowed H$_2$, and the opening degree of the slow leak valve 8 was controlled to control the pressure within the reaction tube 2 to a predetermined value. The pressure in this Example was about 0.1 to 5 Torr. Then, the wafer was heated by current passage through the heater 4. After the wafer has reached a predetermined temperature, a plasma was generated within the reaction tube 2 by applying high frequency power on the plasma generation electrodes 16, 16', 16''. The plasma generation at this time was called "the first plasma". The oscillation frequency of the power source for plasma generation was ca. 13.56 MHz.

After plasma generation, DMAH was introduced through the DMAH line into the reaction tube. The partial pressure of DMAH was ca. $1 \times 10^{-5}$ to $2 \times 10^{-3}$-fold of the total pressure. When DMAH was introduced, Al was deposited. The Al film deposited in this process was called the first Al film.

After elapse of a predetermined time, while maintaining constantly the substrate temperature, the total pressure, the DMAH partial pressure, the generation power of plasma was increased. The plasma generation at this time was called "the second plasma". After elapse of a certain period of time (here, the time during plasma generation was called the surface modification step, and the certain period of time was called the second plasma generation time), while maintaining constantly the total pressure, the DMAH partial pressure and the substrate temperature, again the plasma power was made smaller. The plasma generation state made smaller was called the third plasma. The Al film deposited during the third plasma generation was called the second Al.

After elapse of a predetermined time, heating of the heater 4 was stopped to cool the wafer. Feeding of H$_2$ has was stopped, the reaction vessel 2 was internally evacuated and the wafer was delivered to the conveying chamber. Only the conveying chamber was opened to atmospheric, and the wafer was taken out.

By setting the substrate at 13 levels of 150° C., 160° C., 200° C., 250° C., 270° C., 300° C., 350° C., 370° C., 400° C., 430° C., 450° C., 470° C., and the Al film was deposited according to the procedure as described above.

| During the first Al deposition step: | |
|---|---|
| total pressure: | 0.1 Torr, 1.2 Torr, 5 Torr |
| DMAH partial pressure: | $1 \times 10^{-3}$-fold of total pressure |
| plasma generation power of the first plasma: (W/cm$^3$) | 0.01, 0.015, 0.03, 0.04, 0.06, 0.07, 0.08, 0.10, 0.20, 0.40 |
| During the surface modification step: | |
| total pressure and DMAH partial pressure: the same as in the first Al film deposition step | |
| plasma generation power of the second plasma: (W/cm$^3$) | 0.01, 0.015, 0.03, 0.04, 0.06, 0.07, 0.08, 0.10, 0.20, 0.40 |
| generation time of the second plasma: | 1 min. |
| During the second Al film deposition step: | |
| total pressure, DMAH partial pressure, the same as in the first Al film deposition step | |
| plasma generation power of the third plasma: (W/cm$^3$) the same as in the first Al film deposition step | |

Figure 8A:
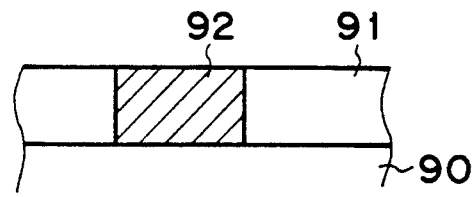
FIGS. 8A-8D are schematic sectional views for illustration of the deposited film formation method according to an example of the present invention as compared with other methods.
Figure 8B:
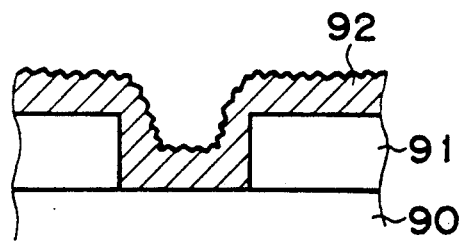
Figure 8C:
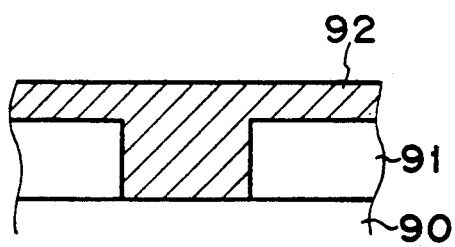
Figure 8D:
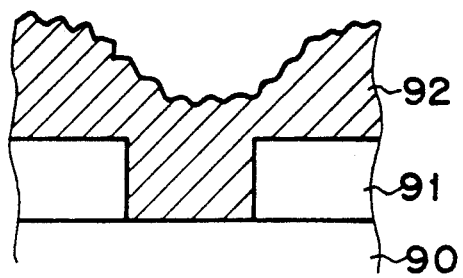

The results of Al deposition were as follows:

In the first Al film deposition step, the manner of Al deposition depended on the first plasma generation power. More specifically, when the first plasma generation power density was 0.01 and 0.015 W/cm$^3$, Al was deposited selectively only on Si as shown in FIG. 8A, and the second Al film deposited via the surface modification step was flat as shown in FIG. 8C. On the other hand, as the power density was greater, Al was deposited not only on Si, but also on SiO$_2$ to form a concavity of Al at the opening as shown in FIG. 8B, and the second Al film formed thereafter had excessive unevenness with inferior flatness as shown in FIG. 8D. The deposition form, containment of carbon, reflectance of the Al film deposited in the first Al film deposition step were shown in Table 4. Also, the deposition form, containment of carbon, reflectance of the Al film deposited in the first Al film deposition step, the surface modification step, the second Al film deposition step were shown in Table 5. In both cases, the results of reflectance were inferior as compared with Example 21. Also substantially the same results were obtained when Al—Si was deposited with addition of Si$_2$H$_6$.

EXAMPLE 37

According to the same procedure as in Example 1, an Si substrate with patterned SiO$_2$ was prepared. Subsequently, by means of the device shown in FIG. 2, the first Al was deposited selectively only on Si similarly as in Example 1. The Si substrate was set in a sputtering device, and RF sputtering etching was effected in an Ar atmosphere of 10$^{-2}$ Torr. With the substrate holder maintained at 200° C., etching was effected by application of a high frequency power of 100 W on high frequency electrodes for 60 seconds. As the result, together with the oxide with an Al surface thickness of about 100 Å, also the surface of SiO$_2$ was removed with the same thickness, and at the same time the SiO$_2$ surface was modified. Next, by use of Al as the target, Al film was deposited by direct current sputtering. The second Al film was deposited uniformly on Si and SiO$_2$ at a deposition rate of 1000 Å/min. under the conditions of an Ar atmosphere of 10$^{-2}$ Torr, a temperature of the substrate holder of 250° C., and a direct current power of 7 KW. No high resistance layer existed at the interface between the first Al film and the second Al film.

Selective growth of the first Al film may be practiced according to any of the methods as previously described in the examples, and non-selective deposition of the second Al film by sputtering etching and sputtering deposition was not limited to the conditions as described above, but can be performed under conventional sputtering conditions.

It was of course possible to deposit selectively a first Al—Si alloy film selectively on Si, remove the surface oxide and the SiO$_2$ surface on the first Al—Si film by sputtering etching, and deposit uniformly a second Al—Si alloy film with an Al—Si alloy as the target.

As described above, according to the present invention, a low resistance, dense and flat Al or Al—Si film can be deposited selectively and at high speed on a substrate. Comparative experiments Al film was formed on a single crystalline silicon under the following conditions.

By flowing Ar in place of H$_2$, Al was deposited by pyrolysis of DMAH. The total pressure at this time was made 1.5 Torr, DMAH partial pressure 1.5×10$^{-4}$ Torr, and the substrate temperature 270° to 350° C.

As the result of evaluation of the Al film thus formed, at least about 2% of carbon was found to be contained. The resistivity became 2-fold or more of that when employing hydrogen.

As to reflectance, it was lowered to about ⅛ to 1/9 relative to the case when employing hydrogen.

Similarly, the wiring life became shorter by 1 to 2 cipher, the hillock generation probability larger by 2 or more ciphers, and a large number of spikes were generated.

As to deposition rate, it was lowered to ½ to ¼.

As described above, Al deposited only by decomposition of DMAH without use of H$_2$ was inferior in film quality and unsatisfactory as the Al film for semiconductor device.

Separately, without use of H$_2$, Al was deposited by decomposition of DMAH according to the optical CVD method. As the result, more or less improvements can be seen as compared with the case when employing no light, such as no containment of carbon in the Al film prepared, etc. However, other characteristics were not improved so much, and the film obtained was still unsatisfactory as the Al film for semiconductor device.

The mechanism of Al deposition according to the present invention as described above may be considered as follows.

Figure 9A:
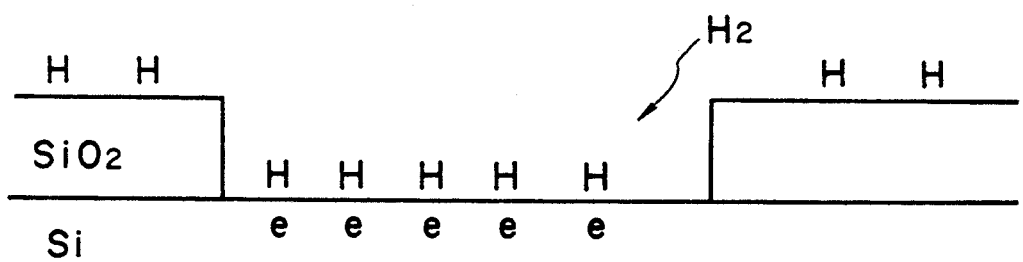
FIGS. 9A-9D are schematic views for illustration of the manner of selective deposition in the deposited film formation method according to the present invention.
Figure 9B:
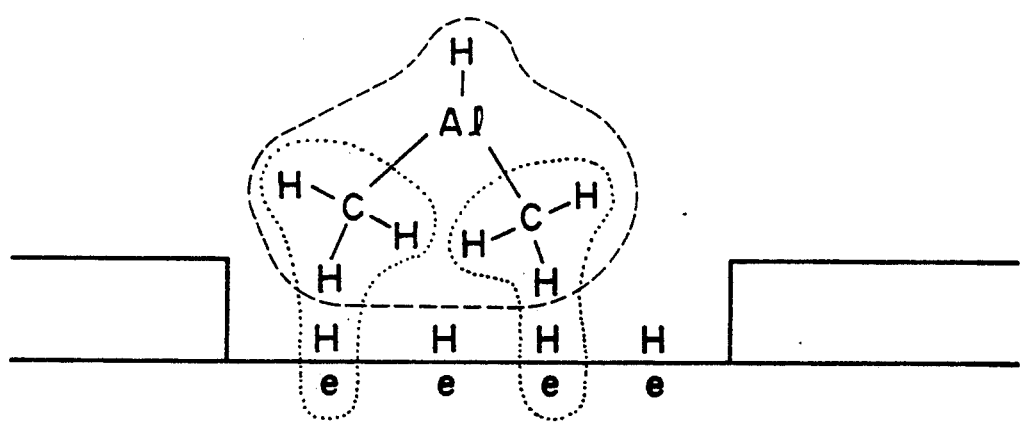
Figure 9C:

When DMAH reaches an electron donative substrate, namely a substrate having electrons under the state attached with hydrogen atoms (FIGS. 9A) with methyl groups directed toward the substrate side, the electron of the substrate cuts the bond between Al and one methyl group (FIGS. 9B and 9C). The reaction scheme at this time may be as follows:

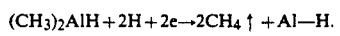

Figure 9D:
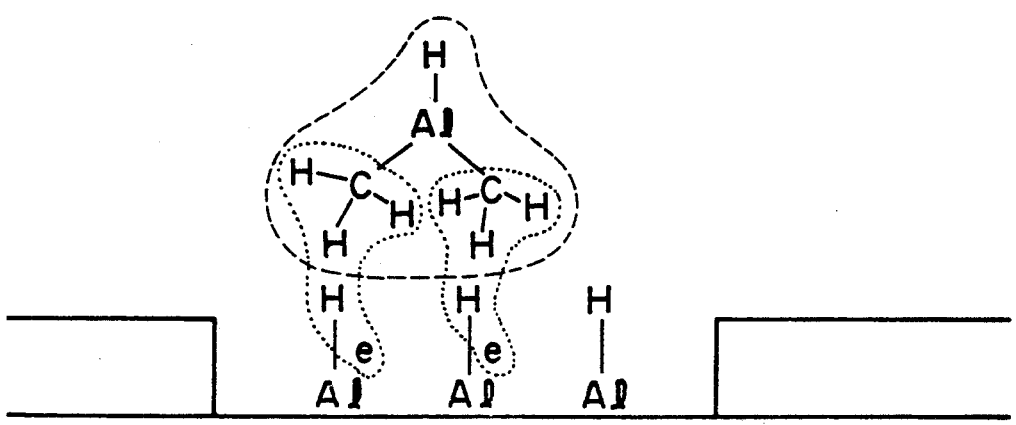

Further, the same reaction proceeds for hydrogen atoms remaining on deposited Al having free electrons (FIG. 9D). Here, when hydrogen atoms are deficient, hydrogen molecules will be decomposed on the substrate and supplied as hydrogen atoms. On the other hand, since there exists no electron on the non-electron donative surface, no such reaction as described above proceeds to effect no deposition of Al.

FIGS. 9A to 9D are illustrations for better understanding of the reaction mechanism, and the numbers of H, e and Al represented in FIGS. 9A to 9D were not necessarily coincident.

And, in the case of Al—Si film, Si atoms are incorporated into Al in such reaction process.

COMPARATIVE EXPERIMENT

An Al film was formed on a monocrystalline silicon under the following conditions.

By passing Ar in place of $H_2$, Al was deposited by pyrolysis of DMAH. The total pressure at this time was made 1.5 Torr, the DMAH partial pressure $1.5 \times 10^{-4}$ Torr, and the substrate temperature of 270°-350° C.

When the Al film thus formed was evaluated, about 2% of carbon was found to be contained at the minimum.

Resistivity became greater by 2-fold or more than the case when hydrogen was employed.

As to reflectance, it was lowered to about ⅓ to 1/9 relative the case when hydrogen was employed.

Similarly, wiring life was shorter by 1 to 2 cipher, generation probability of hillock became greater by 2 cipher or more, and a large number of spikes were found to be generated.

As to the deposition speed, it was lowered to ½ to ¼.

As described above, Al deposited only by decomposition of DMAH without use of $H_2$ is inferior in film quality, and was unsatisfactory as the Al film for a semiconductor device.

Separately, without use of $H_2$, DMAH was decomposed by the optical CVD method to deposit Al. As the result, some improvement such as no containment of carbon, and the like was observed from as the Al film prepared as compared with the case when no light was employed, but other characteristics were not improved so much, and the Al film was still unsatisfactory as the Al film for a semiconductor device.

As described above, the mechanism of Al deposition according to the present invention may be presently hypothesized as follows.

When DMAH reaches the electron donative substrate, namely the substrate having electrons under the state on which hydrogen atoms are attached (FIG. 9A) with the methyl groups directed toward the substrate side, one electron of the substrate cuts one bond of Al and a methyl group (FIGS. 9B and 9C).

The reaction scheme at this time is as follows:

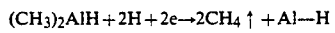

$(CH_3)_2AlH + 2H + 2e \rightarrow 2CH_4 \uparrow + Al—H$

Further, similar reactions will proceed for the hydrogen atoms remaining on deposited Al having free electrons (FIG. 9D). Here, when hydrogen atoms are deficient, hydrogen molecules constituting the reaction gas are decomposed on the substrate to supply hydrogen atoms. On the other hand, since there is no electron on the electron non-donative surface, the above-mentioned reaction will not proceed and no Al deposited.

FIGS. 9A-9D are illustrations for better understanding of the reacion mechanism, and the numbers of H, e and Al shown in FIGS. 9A-9D are not necessarily coincident.

In the case of an Al—Si film, Si atoms are incorporated into Al during the process of the reaction as described above.

As described above, according to the present invention, a low resistance, dense and flat Al or Al—Si film can be deposited selectively and at high speed on a substrate.

TABLE 1

| Evaluation item | Substrate temperature (C°) | | | | | | | | | | | | |
|---|---|---|---|---|---|---|---|---|---|---|---|---|---|
| | 150 | 160 | 200 | 250 | 270 | 300 | 330 | 350 | 370 | 400 | 430 | 450 | 470 |
| Carbon content (%) | — | 0 | 0 | 0 | 0 | 0 | 0 | 0 | 0 | 0 | 0 | 0 | 1~9 |
| Resistivity ($\mu\Omega \cdot cm$) | — | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 |
| Reflectance (%) | — | 85~95 | 85~95 | 85~95 | 85~95 | 85~95 | 85~95 | 85~95 | 85~95 | 85~95 | 70 | 60 or lower | 60 or lower |
| Average wiring life (hour) | — | $10^3 \sim 10^4$ | $10^3 \sim 10^4$ | $10^3 \sim 10^4$ | $10^3 \sim 10^4$ | $10^3 \sim 10^4$ | $10^3 \sim 10^4$ | $10^3 \sim 10^4$ | $10^3 \sim 10^4$ | $10^3 \sim 10^4$ | $10^2 \sim 10^3$ | $10^2 \sim 10^3$ | $10^2 \sim 10^3$ |
| Deposition Speed (Å/min) | — | 1~9 | 100~800 | 100~800 | 100~800 | 100~800 | 100~800 | 100~800 | 100~800 | 100~800 | 100~800 | 100~800 | 1000 |
| Hillock density ($cm^{-2}$) | — | $0 \sim 10^3$ | $0 \sim 10^3$ | $0 \sim 10^3$ | 0~10 | 0~10 | 0~10 | 0~10 | $0 \sim 10^4$ | $0 \sim 10^4$ | $0 \sim 10^4$ | $0 \sim 10^4$ | $0 \sim 10^4$ |
| Spike generation ratio (%) | — | 0~10 | 0~10 | 0 | 0 | 0 | 0 | 0 | 0~30 | 0~30 | 0~30 | 0~30 | 0~30 |

Note: No deposition occurs at the substrate temperature of 150° C. Average wiring life is time to wire breaking when current is passed at a current density of $1 \times 10^6$ A/cm² through a cross-sectional area of 1 μm² at 250° C. Spike generation ratio is destruction probability at the junction portion of 0.15 μm depth.

TABLE 2

| | Monocrystalline Si | PolyCrystalline Si | Amorphous Si | W | Mo | Ta | WSi | TiSi | Al | AlSi |
|---|---|---|---|---|---|---|---|---|---|---|
| T-SiO₂ | 5-1 | 5-11 | 5-21 | 5-31 | 5-41 | 5-51 | 5-61 | 5-71 | 5-81 | 5-91 |
| SiO₂ | 5-2 | 5-12 | 5-22 | 5-32 | 5-42 | 5-52 | 5-62 | 5-72 | 5-82 | 5-92 |
| BSG | 5-3 | 5-13 | 5-23 | 5-33 | 5-43 | 5-53 | 5-63 | 5-73 | 5-83 | 5-93 |
| PSG | 5-4 | 5-14 | 5-24 | 5-34 | 5-44 | 5-54 | 5-64 | 5-74 | 5-84 | 5-94 |
| BPSG | 5-5 | 5-15 | 5-25 | 5-35 | 5-45 | 5-55 | 5-65 | 5-75 | 5-85 | 5-95 |
| P—SiN | 5-6 | 5-16 | 5-26 | 5-36 | 5-46 | 5-56 | 5-66 | 5-76 | 5-86 | 5-96 |
| T-SiN | 5-7 | 5-17 | 5-27 | 5-37 | 5-47 | 5-57 | 5-67 | 5-77 | 5-87 | 5-97 |

TABLE 2-continued

| | | | | | | | | | | | |
|---|---|---|---|---|---|---|---|---|---|---|---|
| LP—SiN | 5-8 | | 5-18 | | 5-28 | 5-38 | 5-48 | 5-58 | 5-68 | 5-78 | 5-88 | 5-98 |
| ECR—SiN | 5-9 | | 5-19 | | 5-29 | 5-39 | 5-49 | 5-59 | 5-69 | 5-79 | 5-89 | 5-92 |

| | | AlTi | Ti—N | Cu | Al—Si—Cu | AlPd | Ti | Mo—Si | Ta—Si |
|---|---|---|---|---|---|---|---|---|---|
| | T-SiO₂ | 5-101 | 5-111 | 5-121 | 5-131 | 5-141 | 5-151 | 5-161 | 5-171 |
| | SiO₂ | 5-102 | 5-112 | 5-122 | 5-132 | 5-142 | 5-152 | 5-162 | 5-172 |
| | BSG | 5-103 | 5-113 | 5-123 | 5-133 | 5-143 | 5-153 | 5-163 | 5-173 |
| | PSG | 5-104 | 5-114 | 5-124 | 5-134 | 5-144 | 5-154 | 5-164 | 5-174 |
| | BPSG | 5-105 | 5-115 | 5-125 | 5-135 | 5-145 | 5-155 | 5-165 | 5-175 |
| | P—SiN | 5-106 | 5-116 | 5-126 | 5-136 | 5-146 | 5-156 | 5-166 | 5-176 |
| | T-SiN | 5-107 | 5-117 | 5-127 | 5-137 | 5-147 | 5-157 | 5-167 | 5-177 |
| | LP—SiN | 5-108 | 5-118 | 5-128 | 5-138 | 5-148 | 5-158 | 5-168 | 5-178 |
| | ECR—SiN | 5-109 | 5-119 | 5-129 | 5-139 | 5-149 | 5-159 | 5-169 | 5-171 |

(note) Numeral shows sample No.

TABLE 3

| | Plasma application power density in surface modification step (W/cm³) | | | | | | | | | | |
|---|---|---|---|---|---|---|---|---|---|---|---|
| | 0.01 | 0.015 | 0.02 | 0.03 | 0.04 | 0.06 | 0.07 | 0.08 | 0.10 | 0.20 | 0.40 |
| Detection of carbon at the interface between selectivity deposited Al and non-selectivity deposited Al | * | * | O | O | O | O | O | x | x | x | x |

*: no surface modification effected, and no Al deposited on the non-electron donative surface
O: no carbon detected at the interface by SIMS analysis
x: carbon detected at the interface by SIMS analysis

TABLE 4

| | First plasma generation density W/cm³ | | | | | | | | | | |
|---|---|---|---|---|---|---|---|---|---|---|---|
| | 0.01 | 0.015 | 0.02 | 0.03 | 0.04 | 0.06 | 0.07 | 0.08 | 0.10 | 0.20 | 0.4 |
| Deposition form of the first Al film | | | | | | | | | | | |
| Substrate temperature 150° C. | ← | | | | Not deposited | | | | | → | |
| Substrate temperature 160° C.–450° C. | ←FIG. 8A→ | ← | | | FIG. 8B | | | | | → | |
| Carbon containment in the first Al film | | | | | | | | | | | |
| Substrate temperature 160° C.–450° C. | | No carbon detected | | | → | ← | Trace amount of carbon | | → | | |
| Substrate temperature 470° C. | ← | | | | Several % of carbon | | | | | → | |
| Reflectance | | | | | | | | | | | |
| Substrate temperature 160° C.–400° C. | ← | | 70~80% | | | → | ← | 60% or less | | → | |
| Substrate temperature 430° C.–470° C. | ← | | | | 60% or less | | | | | → | |

TABLE 5

| Second plasma generation power (W/cm³) | First and third plasma generation power (W/cm³) | | | | | | | | | | |
|---|---|---|---|---|---|---|---|---|---|---|---|
| | 0.01 | 0.015 | 0.02 | 0.03 | 0.04 | 0.06 | 0.07 | 0.08 | 0.10 | 0.2 | 0.4 |
| 0.01 | * | | | | | | | | | | |
| 0.015 | * | * | | | | | | | | | |
| 0.02 | 1<br>R1 | 1<br>R1 | 1<br>R1 | | | | | | | | |
| 0.03 | 1<br>R1 | 1<br>R1 | 1<br>R1 | 1<br>R1 | | | | | | | |
| 0.04 | 1<br>R1 | 1<br>R1 | 1<br>R1 | 1<br>R1 | 1<br>R1 | | | | | | |
| 0.06 | 1<br>R1 | 1<br>R1 | 1<br>R1 | 1<br>R1 | 1<br>R1 | 1<br>R1 | | | | | |
| 0.07 | 1<br>R1 | 1<br>R1 | 1<br>R1 | 1<br>R1 | 1<br>R1 | 1<br>R1 | 1<br>R2 | | | | |
| 0.08 | 2<br>R1 | 2<br>R1 | 2<br>R1 | 2<br>R1 | 2<br>R1 | 2<br>R2 | 2<br>R2 | 3<br>R2 | | | |
| 0.10 | 2<br>R1 | 2<br>R1 | 2<br>R1 | 2<br>R1 | 2<br>R2 | 2<br>R2 | 2<br>R2 | 3<br>R2 | 3<br>R2 | | |
| 0.2 | 2<br>R1 | 2<br>R1 | 2<br>R1 | 2<br>R2 | 2<br>R2 | 2<br>R2 | 2<br>R2 | 3<br>R2 | 3<br>R2 | 3<br>R2 | |
| 0.4 | 2<br>R1 | 2<br>R1 | 2<br>R1 | 2<br>R1 | 2<br>R2 | 2<br>R2 | 2<br>R2 | 3<br>R2 | 3<br>R2 | 3<br>R2 | 3<br>R2 |

TABLE 5-continued

| Second plasma generation power (W/cm³) | First and third plasma generation power (W/cm³) | | | | | | | | | | |
|---|---|---|---|---|---|---|---|---|---|---|---|
| | 0.01 | 0.015 | 0.02 | 0.03 | 0.04 | 0.06 | 0.07 | 0.08 | 0.10 | 0.2 | 0.4 |
| Deposition form | FIG. 7C | | | | | FIG. 7D | | | | | |

When the substrate temperature was 160° C. to 400° C..
\*: no Al deposited on SiO₂
1: no carbon detected in first and second Al films, no carbon also detected at the interface between first and second Al films
2: no carbon detected in first and second Al films, but carbon detected at the interface between first and second Al films
3: carbon detected in first and second Al films
R1: reflectance 65-75%
R2: reflectance 60% or less

What is claimed is:

1. A deposited film formation method comprising the steps of:
   (a) selectively forming by chemical vapor depositing a metal deposit composed mainly of aluminum on an electron donative surface of a substrate having said electron donative surface and a non-electron donative surface by employing an alkyl aluminum hydride as a raw gas material; and
   (b) non-selectively forming a metal film composed mainly of aluminum on said selectively formed metal deposit and on said non-electron donative surface by a deposition method different from said chemical vapor deposition.

2. A deposited film formation method comprising the steps of:
   (a) selectively forming by chemical vapor depositing a metal deposit composed mainly of aluminum on an electron donative surface of a substrate having said electron donative surface and a non-electron donative surface by employing an alkyl aluminum hydride as a raw gas material; and
   (b) non-selectively forming a metal film composed mainly of aluminum on said selectively formed metal deposit and on a modified non-electron donative surface.

3. A deposited film formation method according to claim 1, wherein said metal deposit is pure aluminum.

4. A deposited film formation method according to claim 1, wherein said metal deposit further comprises Si.

5. A deposited film formation method according to claim 1, wherein the step of non-selectively forming said metal film is carried out by plasma chemical vapor deposition.

6. A deposited film formation method according to claim 2, wherein said metal deposit is pure aluminum.

7. A deposited film formation method according to claim 2, wherein said metal deposit further comprises Si.

8. A deposited film formation method according to claim 2, wherein said alkyl aluminum hydride is dimethyl aluminum hydride.

9. A deposited film formation method according to claim 2, wherein said alkyl aluminum hydride is monomethyl aluminum hydride.

10. A deposited film formation method according to claim 2, wherein said modified non-electron donative surface is modified by forming a nucleus containing free electrons onto said non-electron donative surface.

11. A deposited film formation method according to claim 2, wherein said modified non-electron donative surface is modified by forming a thin film containing free electrons onto said non-electron donative surface.

12. A deposited film formation method according to claim 2, wherein said modified non-electron donative surface is modified by treating said non-electron donative surface with a plasma.

13. A deposited film formation method according to claim 2, wherein said modified non-electron donative surface is modified by introducing a gas containing titanium atom.

14. A deposited film formation method according to claim 2, wherein said modified non-electron donative surface is modified by introducing a gas containing silicon atom.

15. A deposited film formation method according to claim 2, wherein said modified non-electron donative surface is modified by elevating the temperature of said non-electron donative surface higher than the temperature during said selective forming of a metal deposit.

16. A deposited film formation method according to claim 2, wherein said modified non-electron donative surface is modified by irradiating a light having greater energy than the optical forbidden gap width of the material constituting said non-electron donative surface.

17. A deposited film formation method according to claim 2, wherein said modified non-electron donative surface is modified by irradiating said non-electron donative surface with ions.

18. A deposited film formation method according to claim 2, wherein said modified non-electron donative surface is modified by irradiating said non-electron donative surface with an electron beam.

19. A deposited film formation method according to claim 1, wherein no plasma is generated during the selective formation step of said metal deposit.

20. A deposited film formation method according to claim 1, wherein a plasma is generated with a low power which does not deposit aluminum on said non-electron donative surface during the selective formation step of said metal deposit.

21. A deposited film formation method according to claim 1, wherein said alkyl aluminum hydride is dimethyl aluminum hydride.

* * * * *

UNITED STATES PATENT AND TRADEMARK OFFICE
CERTIFICATE OF CORRECTION

PATENT NO. : 5,180,687

DATED : January 19, 1993

INVENTOR(S) : NOBUO MIKOSHIBA, ET AL.

It is certified that error appears in the above-identified patent and that said Letters Patent is hereby corrected as shown below:

Title Page:

IN [56] REFERENCES CITED

Under FOREIGN PATENT DOCUMENTS:
"1252776  10/1989  Japan" should read
--1-252776  10/1989  Japan--;
"2012913  1/1990  Japan" should read
--2-12913  1/1990  Japan--; and
"2170419  7/1990  Japan" should read
--2-170419  7/1990  Japan--.

Under OTHER PUBLICATIONS:
"Pierson," should read --Pierson, "Aluminum Coatings by the Decomposition of Alkyls*",--.

COLUMN 1

Line 16, "steel" should read --metal--.
Line 40, "data" should read --date--.
Line 49, "ration" should read --ratio--.

COLUMN 2

Line 17, "molecular" should read --molecule--.

COLUMN 4

Line 13, "difficulty controllable," should read --difficultly controllable,--.

COLUMN 8

Line 60, "constituent" should read --constituents--.

COLUMN 9

Line 31, "used" should read --use--.

UNITED STATES PATENT AND TRADEMARK OFFICE
CERTIFICATE OF CORRECTION

PATENT NO. : 5,180,687
DATED : January 19, 1993
INVENTOR(S) : NOBUO MIKOSHIBA, ET AL.

It is certified that error appears in the above-identified patent and that said Letters Patent is hereby corrected as shown below:

COLUMN 25

Line 32, "thorugh" should read --through--.

COLUMN 26

Line 59, "stpe" should read --step--.

COLUMN 27

Line 40, insert: --$Si_2H_6$ was made equal during the first Al-Si--.

COLUMN 29

Line 16, "DMAH" should read --DMAH.--.

COLUMN 34

Line 25, "proportion" should read --proportional--.
Line 41, "10 minutes" should read --10 minutes,--.

COLUMN 35

Line 47, "Al-Sl film" should read --Al-Si film--.
Line 68, "stpe," should read --step,--.

COLUMN 36

Line 62, "has" should be deleted.
Line 68, "and" should be deleted.

UNITED STATES PATENT AND TRADEMARK OFFICE
CERTIFICATE OF CORRECTION

PATENT NO. : 5,180,687
DATED : January 19, 1993
INVENTOR(S) : NOBUO MIKOSHIBA, ET AL.

It is certified that error appears in the above-identified patent and that said Letters Patent is hereby corrected as shown below:

COLUMN 38

Line 20, "substrate. Comparative" should read
         --substrate. ¶ Comparative--.

COLUMN 40

Line 27, "reacion" should read --reaction--.

COLUMN 42

TABLE 2-continued, "5-98     should    --5-98
                               5-92"     read      5-99--;

and   "5-178    should    --5-178
            5-171"    read      5-179--.

Signed and Sealed this

First Day of February, 1994

Attest:

BRUCE LEHMAN

Attesting Officer     Commissioner of Patents and Trademarks